US012809075B2

(12) United States Patent
Siddique et al.

(10) Patent No.: US 12,809,075 B2
(45) Date of Patent: Nov. 24, 2026

(54) SIMULTANEOUS PHASE AND POLARIZATION MODULATION BY HYBRID METASURFACE FOR ON-CHIP POLARIZATION FILTERS

(71) Applicant: Samsung Electronics Co., Ltd., Suwon-si (KR)

(72) Inventors: Radwanul Hasan Siddique, Pasadena, CA (US); MohammadSadegh Faraji-Dana, Pasadena, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/222,418

(22) Filed: Jul. 14, 2023

(65) Prior Publication Data

US 2023/0358936 A1 Nov. 9, 2023

Related U.S. Application Data

(63) Continuation of application No. 17/005,304, filed on Aug. 27, 2020, now Pat. No. 11,774,655.

(Continued)

(51) Int. Cl.
*G02B 5/30* (2006.01)
*H04N 23/55* (2023.01)
*H10F 39/00* (2025.01)

(52) U.S. Cl.
CPC ......... *G02B 5/3025* (2013.01); *G02B 5/3083* (2013.01); *H10F 39/8053* (2025.01); *H04N 23/55* (2023.01)

(58) Field of Classification Search
CPC .. G02B 5/3025; G02B 5/3083; G02B 5/3058; H01L 27/14621; H04N 23/55
See application file for complete search history.

(56) References Cited

U.S. PATENT DOCUMENTS 7,847,231 B2 12/2010 Hirose
8,488,979 B2 7/2013 Kim et al.
(Continued)

FOREIGN PATENT DOCUMENTS

CN 101881599 A 11/2010
CN 102870018 A 1/2013
(Continued)

OTHER PUBLICATIONS

Corrected Notice of Allowability for U.S. Appl. No. 17/005,304, mailed Sep. 5, 2023.

(Continued)

*Primary Examiner* — Angela M. Medich
(74) *Attorney, Agent, or Firm* — Renaissance IP Law Group LLP

(57) ABSTRACT

A filter for an imaging device includes an array of phase-modulating nanostructures formed on a substrate. At least one phase-modulating nanostructure of the array of phase-modulating nanostructures changes a phase of incident light a predetermined amount based on a first width and a second width of the phase-modulating nanostructure in which the first width is perpendicular to the second width. In one embodiment, the filter focuses light incident on the filter towards a center a pixel of an image sensor at an image plane. In another embodiment, the phase-modulating nano-structure is formed from a material having a refractive index that is greater than 1.9. The filter can also be used to form a quarter-wave plate.

5 Claims, 27 Drawing Sheets

Related U.S. Application Data

(60) Provisional application No. 62/950,930, filed on Dec. 19, 2019.

(56) References Cited

U.S. PATENT DOCUMENTS

| | | | | |
|---|---|---|---|---|
| 8,547,504 | B2 | 10/2013 | Guo et al. | |
| 9,976,906 | B2 | 5/2018 | Ma et al. | |
| 10,901,149 | B2 | 1/2021 | Kim et al. | |
| 10,976,472 | B2 | 4/2021 | Lee et al. | |
| 11,042,119 | B2 | 6/2021 | Rho et al. | |
| 2004/0208646 | A1 | 10/2004 | Choudhary et al. | |
| 2007/0217008 | A1* | 9/2007 | Wang | G02B 5/3058 359/485.05 |
| 2017/0199391 | A1 | 7/2017 | Otsuka | |
| 2020/0344430 | A1* | 10/2020 | Wang | H04N 25/571 |
| 2021/0190593 | A1* | 6/2021 | Yao | G02B 1/002 |

FOREIGN PATENT DOCUMENTS

| | | | |
|---|---|---|---|
| JP | 5587057 | B2 | 9/2014 |
| KR | 20180090613 | A | 8/2018 |
| KR | 20190011121 | A | 2/2019 |
| KR | 20190026201 | A | 3/2019 |
| KR | 20190111292 | A | 10/2019 |
| WO | 2019126656 | A2 | 6/2019 |

OTHER PUBLICATIONS

Maruyama, Yasushi et al., "3.2-MP Back-Illuminated Polarization Image Sensor With Four-Directional Air-Gap Wire Grid and 2.5-μm Pixels", in IEEE Transactions on Electron Devices, vol. 65, No. 6, pp. 2544-2551, Jun. 2018.

Notice of Allowance for U.S. Appl. No. 17/005,304, mailed Apr. 19, 2023.

Office Action for U.S. Appl. No. 17/005,304, mailed Dec. 7, 2022.

* cited by examiner

SIMULTANEOUS PHASE AND POLARIZATION MODULATION BY HYBRID METASURFACE FOR ON-CHIP POLARIZATION FILTERS

CROSS-REFERENCE TO RELATED APPLICATION

This application is a continuation of U.S. patent application Ser. No. 17/005,304, filed on Aug. 27, 2020, which claims the priority benefit under 35 U.S.C. § 119(e) of U.S. Provisional Patent Application Ser. No. 62/950,930, filed on Dec. 19, 2019, the disclosures of which are incorporated herein by reference in their entirety.

TECHNICAL FIELD

The subject matter disclosed herein relates to image sensors. More specifically, the subject matter disclosed herein relates to a multifunctional polarization filter that includes nanostructures that change the phase, amplitude and polarization of incident light based on dimensions of the nanostructures.

BACKGROUND

Polarization is a property of light that indicates the geometrical orientation of the oscillations, or vibrations, of the electromagnetic (EM) fields of the light. The EM vibrations may be directed to a specific direction using a polarizer or a polarizing filter. The general orientation of polarized light is x- or y-directed with a phase y between the x and y axes. The general polarization of light may be in the horizontal, or x direction, or in the vertical, or y direction, with a phase $\phi$ between the x and y axes. By determining the amplitude of electric field in, for example, x and y directions and the relative phase between the x and y direction, a full Stokes polarization state of the light may be determined.

FIG. 1A depicts unpolarized light 100 passing through a horizontally polarized filter 101. The light 102 that passes through the horizontally polarizing filter 101 is horizontally polarized. FIG. 1B depicts unpolarized light 100 passing through a vertically polarization filter 103. The light 104 that passes through the vertically polarization filter 103 is vertically polarized. The polarization filters 101 and 103 may also be referred to as linear polarizers. The polarization filters 101 and 103 may alternatively be oriented in other directions than shown in FIGS. 1A and 1B, in which case the light passing through the polarizing filter will have an orientation corresponding to the orientation of the polarizing filter.

Light may also be circularly polarized as left-hand circularly polarized (LHCP) or as right-hand circularly polarized (RHCP). FIG. 1C depicts an example in which light 105 has been circularly LHCP polarized. If, for example, the circularly polarized light 105 passes through a quarter wave plate 106, the light becomes linearly polarized light 107, which then may be further filtered, or polarized, by a linear polarizer 108. FIG. 1D depicts an example in which light 110 has been RHCP polarized. If, for example, the circularly polarized light passes through a quarter wave plate 111, the light becomes linearly polarized light 112, which then may be further filtered, or polarized, by a linear polarizer 113.

Detection of the polarization of light may be used for ranging an object in poor visibility conditions, for example, in an advanced driver-assistance system (ADAS). Detection of the polarization of light may also be used to detect a specular surface, that is, whether a point on a surface is level with another point. After light has been reflected from a specular surface, light rays are oriented parallel with each other and are propagating in the same direction. Other applications of polarized light include rejecting multipath reflections of objects based on the polarization of the reflected image of an object being different from the polarization of the actual image of the object. Industrial applications of polarized light may include detecting defects of manufactured objects.

SUMMARY

An example embodiment provides a filter for an imaging device that may include a substrate and an array of phase-modulating nanostructures formed on the substrate. At least one phase-modulating nanostructure of the array of phase-modulating nanostructures may change a phase of incident light a predetermined amount based on a first width and a second width of the phase-modulating nanostructure in which the first width is perpendicular to the second width. In one embodiment, the phase-modulating nanostructure may be formed from a material having a refractive index that is greater than 1.9. In another embodiment, the phase-modulating nanostructure may be formed from at least one of silicon, silicon nitride ($Si_3N_4$), titanium dioxide ($TiO_2$), gallium nitride (GaN), Zinc oxide (ZnO), hafnium silicate, zirconium silicate, hafnium dioxide or zirconium dioxide. In one embodiment, the phase-modulating nanostructure inelastically scatters light incident on the filter. In still another embodiment, the filter may focus light incident on the filter towards a center a pixel of an image sensor at an image plane, and a field of view of the filter may be at least 30 degrees for a normalized intensity of 1.

An example embodiment provides a filter for an imaging device that may include a substrate and an array of phase-modulating nanostructures formed on the substrate. At least one phase-modulating nanostructure of the array of phase-modulating nanostructures may change a phase of incident light a predetermined amount based on a first width and a second width of the phase-modulating nanostructure in which the first width is perpendicular to the second width, and the phase-modulating nanostructure may be formed from a material having a refractive index that is greater than 1.9. In one embodiment, the filter may include a quarter-wave plate.

An example embodiment provides a filter for an imaging device that may include a wire grid and an array of phase-modulating nanostructures formed on the wire grid. At least one phase-modulating nanostructure of the array of phase-modulating nanostructures may change a phase of incident light a predetermined amount based on a first width and a second width of the phase-modulating nanostructure in which the first width may be perpendicular to the second width. The phase-modulating nanostructure may be formed from a material having a refractive index that is greater than 1.9, and a field of view of the filter may be at least 30 degrees for a normalized intensity of 1. In one embodiment, the filter may focus light incident on the filter towards a center a pixel of an image sensor at an image plane. In another embodiment, the filter may include a quarter-wave plate.

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1B:
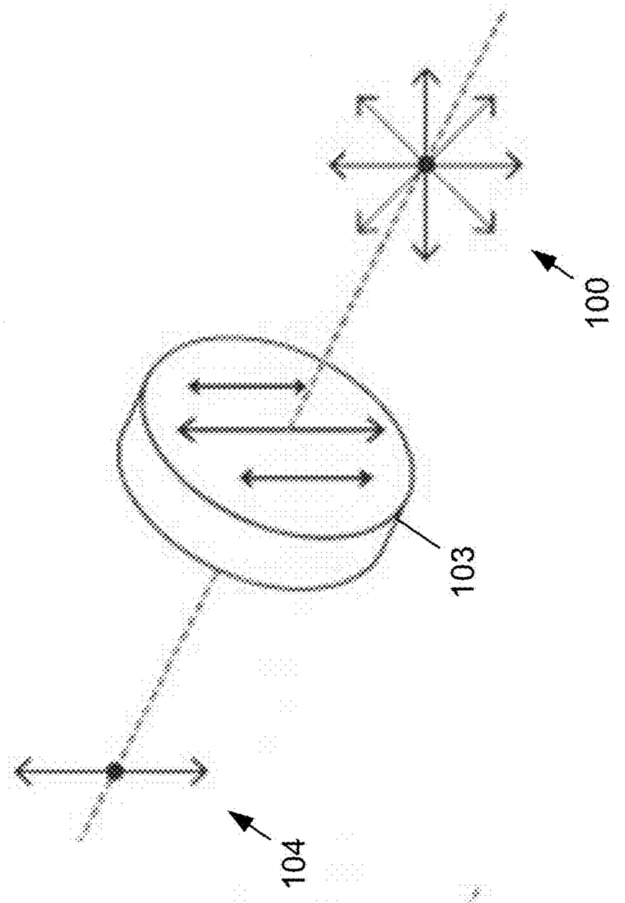
Prior Art FIG. 1B
FIG. 1B depicts an equivalent representation of FIG. 1A.
Figure 1A:
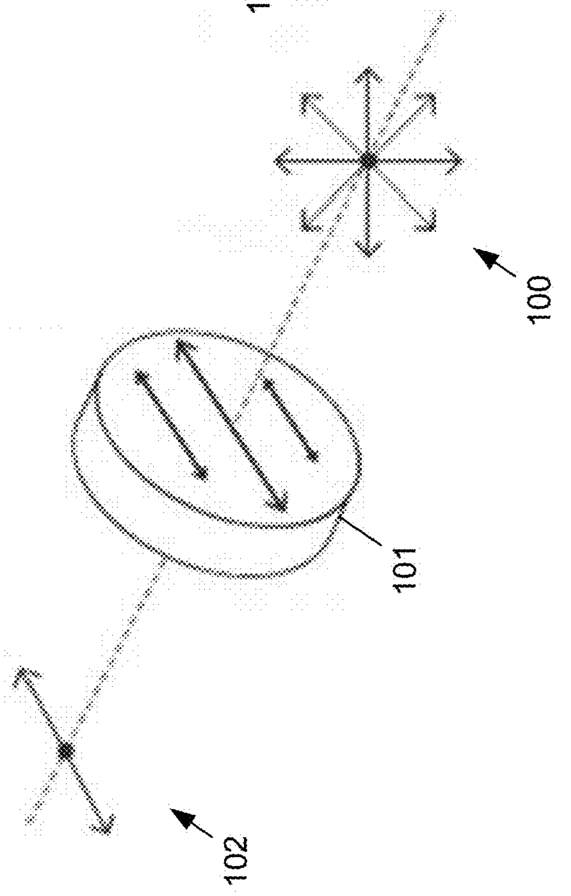
Prior Art FIG. 1A
FIG. 1A depicts unpolarized light passing through a horizontally polarized filter.
Figure 1C:
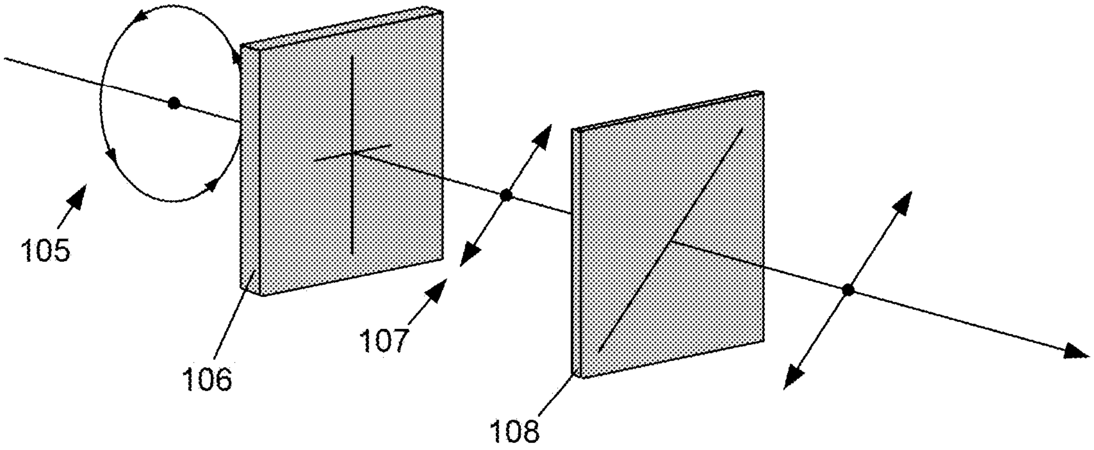
Prior Art FIG. 1C
FIG. 1C depicts an example in which light has been left-hand circularly polarized with respect to two orthogonal directional axes.
Figure 1D:
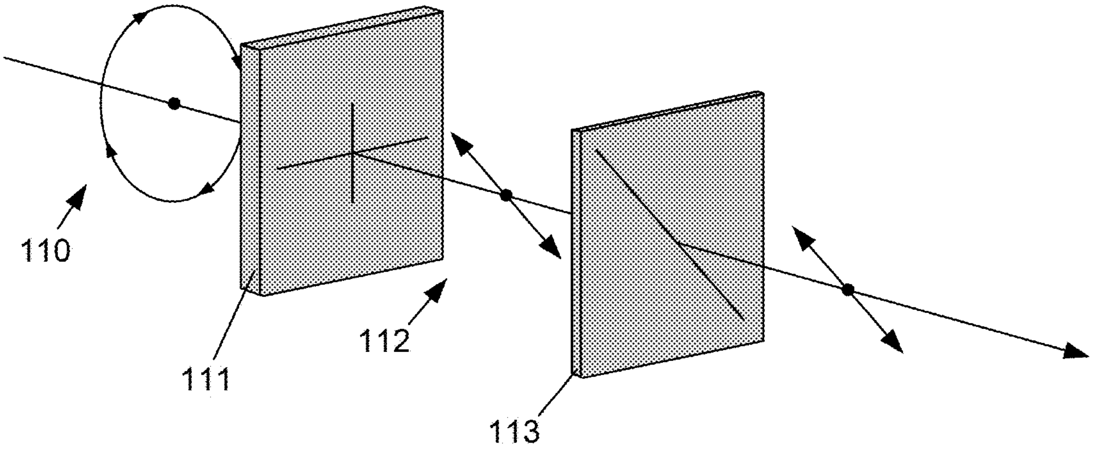
Prior Art FIG. 1D
FIG. 1D depicts an example in which light has been right-hand circularly polarized with respect to two orthogonal axes.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides a multifunctional polarization filter that includes nanostructures that change the phase of incident light a predetermined amount based on dimensions of the nanostructures. In one embodiment, the dimensions of the nanostructures include a first width and a second width that is perpendicular to the first width.

A multifunctional polarization filter may be formed that includes a wire grid and the nanostructures to provide both simultaneous polarization and phase modulation of incident light to focus the light toward the center of a pixel of an image sensor and to reduce angle dependency and crosstalk and 0-th order effect between pixels (and between N×N unit-cell pixels) of the image sensor. No microlens is needed at the pixel because the multifunctional polarization filters can focus the incident light.

In one embodiment, the multifunctional polarization filter disclosed herein may provide full Stokes imaging for detecting both linear and circular polarization for near infrared (NIR) light (700 nm-900 nm) for an N×N unit-cell pixel. The multifunctional polarization filter disclosed herein may be designed for other wavelengths of light. The multifunctional polarization filter may also provide high QE efficiency (greater than 95% transmission for certain polarizations) for each N×N unit-cell pixel of an image sensor, thereby making the image sensor less angle-dependent in comparison to traditional image sensors.

In one embodiment, the multifunctional polarization filter disclosed herein provides a high-efficiency on-chip polarization filter that provides complete polarization-state detection and may be used for multifunctional purposes, such as, but not limited to, ADAS, industrial and healthcare applications.

Figure 2A:
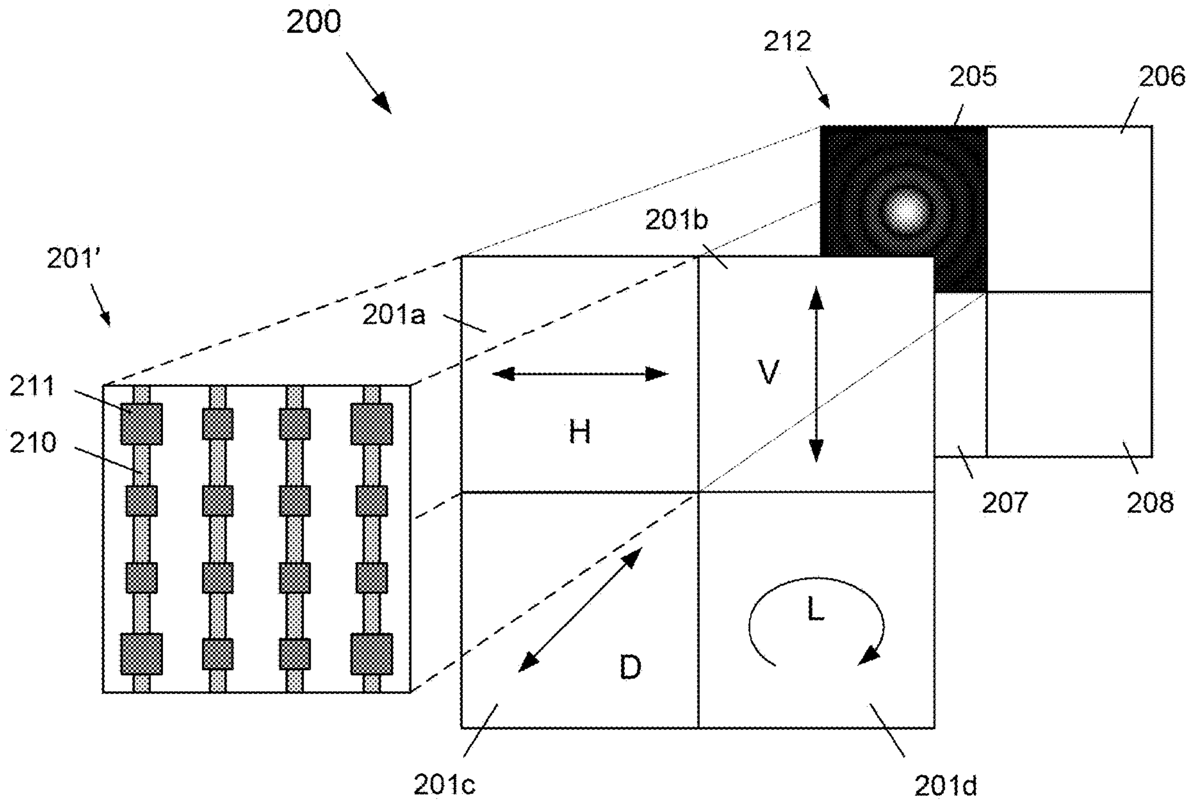
FIG. 2A depicts an example embodiment of an arrangement of four multifunctional polarization filters with respect to four pixels that may be used to detect six polarization states according to the subject matter disclosed herein.

FIG. 2A depicts an example embodiment of an arrangement 200 of four multifunctional polarization filters 201*a*-201*d* with respect to four pixels 205-208 that may be used to detect six polarization states according to the subject matter disclosed herein. The four multifunctional polarization filters 201*a*-201*d* respectively correspond to the four pixels 205-208. The four pixels 205-208 form an N×N unit-cell pixel. (For this example, N equals 2.) Each respective pixel 205-208 includes a photodetector (not shown).

The filter 201*a* (H) horizontally polarizes light passing through the filter 201*a*. The filter 201*b* (V) vertically polarizes light. The filter 201*c* (D) diagonally polarizes light, and the filter 201*d* (L) circularly polarizes light. In an alternative embodiment, six polarization filters and six pixels may be used. The additional two polarization filters in the alternative embodiment would be an anti-diagonally (A) polarization filter and a circularly (R) polarization filter that would polarize light in the opposite circular direction from the circularly polarization filter 201*d*.

Additional details of the polarization filter 201 are depicted at 201', which shows a top view of the polarization filter 201*a*. The polarization filter 201*a* includes a wire grid 210, of which only one wire of the wire grid is indicated, and one or more phase-modulating nanostructures, or metasurfaces, 211, of which only one nanostructure is indicated.

The orientation of the wire grid 210 may be selected to control, or modulate, the polarization of light provided by a polarization filter 201. For example, the wire grid 210 horizontally polarizes the light passing through the polarization filter 201*a*, and the nanostructures 211 change, or modulate, the phase of the light that passes through the polarization filter 201*a*. The other polarization filters 201*b*-201*d* also include a wire grid (not shown) that may have a series of metal-insulator-metal (MIM) structure and one or more nanostructures (also not shown).

The wires of the wire grid may include a series of metal-insulator-metal (MIM) structures that suppresses reflection from cross-polarization. The metal portion of a wire may be formed from any metal or doped semiconductor, such as, but not limited to, aluminum (Al), gold (Au), silver (Ag), titanium (Ti), tungsten (W), copper (Cu), palladium (Pd), tantalum (Ta), tantalum nitride (TaN), Niobium (Nb) and p-doped silicon (p-Si). The insulator portion of a wire may be formed from any dielectric material like oxides, such as, but not limited to, aluminum oxide ($Al_2O_3$), silicon dioxide ($SiO_2$), silicon nitride ($Si_3N_4$), titanium dioxide ($TiO_2$), zinc oxide (ZnO), hafnium silicate ($HfSiO_4$), zirconium silicate ($ZrSiO_4$), hafnium dioxide ($HfO_2$), and zirconium dioxide ($ZrO_2$) and/or semiconductors, like silicon (a-Si, p-Si). In one embodiment, a thickness t of the insulator layer may range from about a few nanometers to a few hundred nanometers.

The pattern of light that is generated by the polarization filter 201*a* and that is focused at the pixel 205 is depicted at 212. The size and shape of the nanostructures 211 may control, or modulate, the phase of light passing through a polarization filter 201 to focus the light at the pixel 205. Additionally, the nanostructures 211 may affect how light passing through a polarization filter 201 may be scattered, may also reduce the backscattering of the incident light, and may also help detect circular polarization. The nanostructures of the circularly polarization filter 201*d* provide a 90-degree phase shift so that the circularly polarization filter operates as a quarter wave plate. The nanostructures 211 may be formed from a high dielectric index material, such as amorphous silicon (a-Si), crystalline silicon (c-Si), p-Si, silicon nitride ($Si_3N_4$), titanium dioxide ($TiO_2$), gallium nitride (GaN), Zinc oxide (ZnO), hafnium silicate, zirconium silicate, hafnium dioxide and zirconium dioxide. In one embodiment, the nanostructures 211 may be formed from a material having a refractive index that is greater than 1.9 at the desired wavelength.

Figure 2B:
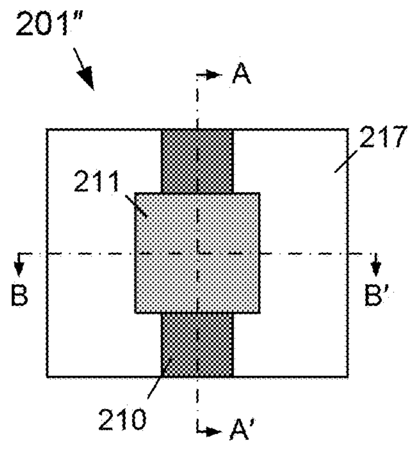
FIGS. 2B-2D respectively depict a top view and two cross-sectional view of an enlarged portion of a polarization filter according to the subject matter disclosed herein.
Figure 2C:
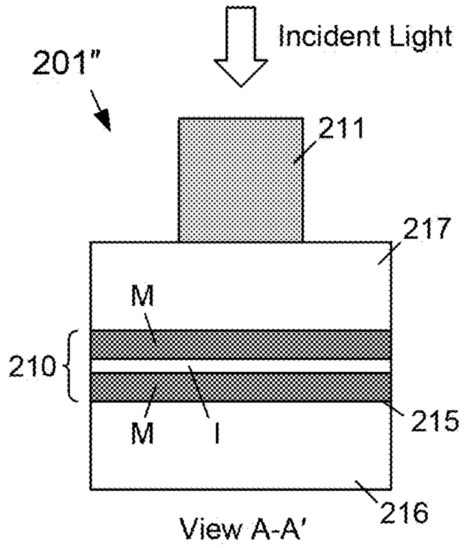
Figure 2D:
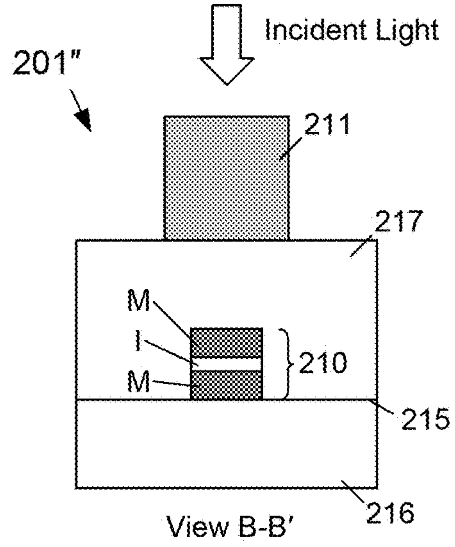

FIGS. 2B-2D respectively depicts a top view and two cross-sectional views of an enlarged portion 201" of the polarization filter 201*a* according to the subject matter disclosed herein. FIG. 2B depicts a top view of the enlarged portion 201" of the polarization filter. FIG. 2C is a cross-sectional view of the enlarged portion 201" taken along line A-A' in FIG. 2B, and FIG. 2D is a cross-sectional view taken along line B-B' in FIG. 2B. As depicted in FIGS. 2B-2D, the polarization filter 201*a* includes a wire grid (of which only one wire 210 is depicted) that is formed on a surface 215 of a detector substrate 216. The wire 210 may include an MIM structure. The surrounding medium of the wire-grids can be air or empty or low-refractive index medium. Otherwise, a capping layer 217 of a dielectric or a polymer, such as: aluminum oxide ($Al_2O_3$), silicon dioxide ($SiO_2$), silicon nitride ($Si_3N_4$), silicon oxynitride ($Si_xN_yO_z$), silicon oxide (SiO), photoresists, epoxy resins and/or other materials. The dielectric layer 217 may be formed on the wire grid and the surface 215 of the detector substrate 216. The dielectric layer 217 may be substantially optically transparent, and may be formed by chemical vapor deposition (CVD), plasma enhanced CVD (PECVD), physical vapor deposition (PVD), atomic layer deposition (ALD), evaporation, spin-on coating, and/or other processes. A plurality of nanostructures 211 (of which only one nanostructure is depicted) may be formed on the capping polymer 217 in vertical coincidence with a wire 210.

Figure 3B:
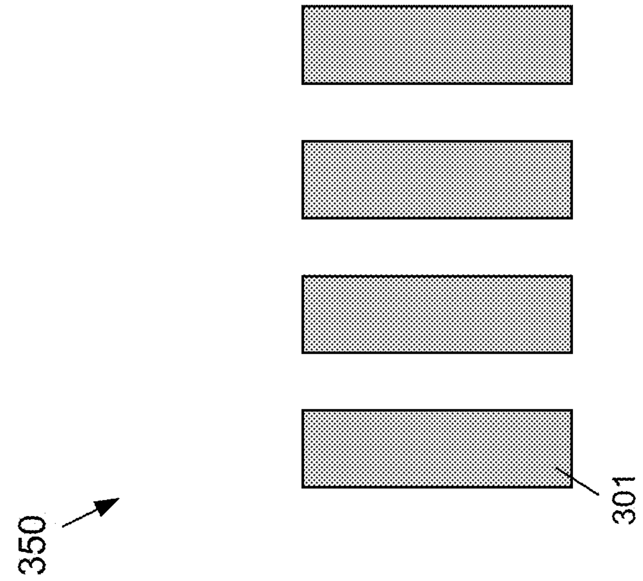
FIG. 3B depicts a cross-sectional view of a typical wire grid having wires formed from a metal.
Figure 3A:
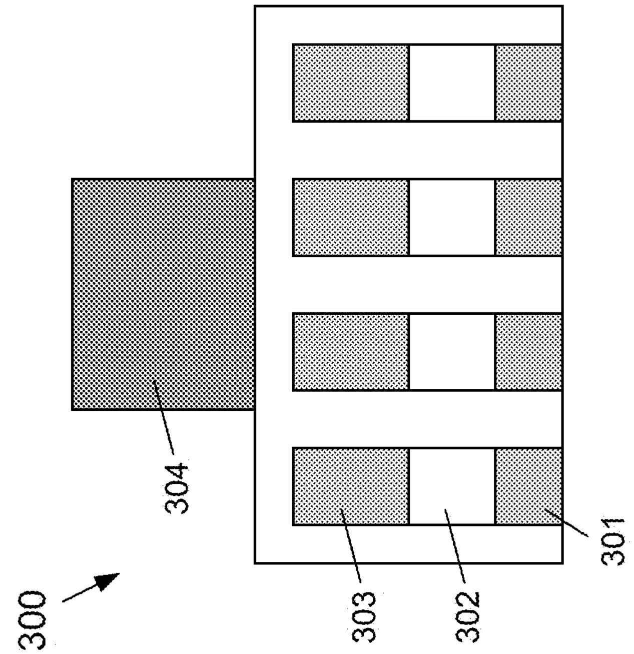
FIG. 3A depicts a cross-sectional view of a wire grid having a metal-insulator-metal (MIM) structure that suppresses reflection from cross-polarization according to the subject matter disclosed herein.

FIG. 3A depicts a cross-sectional view of a wire grid 300 having a metal-insulator-metal (MIM) structure that suppresses reflection from cross-polarization according to the subject matter disclosed herein. FIG. 3B depicts a cross-sectional view of a typical wire grid 350 that does not include an MIM structure and does not suppress reflections. The MIM structure of the wire grid 300 of FIG. 3A includes a first metal wire layer 301, a dielectric layer 302, and a second metal wire layer 303. A phase-modulating nanostructure 304 is shown formed on the wire grid 300. Although only a single MIM structure is depicted in FIG. 3A, in alternative embodiments multiple MIM structures may be used that are stacked on each other. For example, if two MIM structures were to be stacked on each other, the resulting structure would be an MIMMIM structure. The two middle M layers could be formed from the same metal material or from different metal materials.

The first and second wire layers 301 and 303 may be formed from any metal or doped semiconductor, such as, but not limited to, aluminum (Al), gold (Au), silver (Ag), titanium (Ti), tungsen (W), copper (Cu), palladium (Pd), tantalum (Ta), tantalum nitride (TaN), niobium (Nb) and p-doped silicon (p-Si). The dielectric layer 402 may be formed from any dielectric material like oxides, such as, but not limited to, aluminum oxide ($Al_2O_3$), silicon dioxide ($SiO_2$), silicon nitride ($Si_3N_4$), titanium dioxide ($TiO_2$), zinc oxide (ZnO), hafnium silicate ($HfSiO_4$), zirconium silicate ($ZrSiO_4$), hafnium dioxide ($HfO_2$), and zirconium dioxide ($ZrO_2$) and/or semiconductors, like silicon (a-Si, p-Si). In one embodiment, the thickness t of the dielectric layer 302 may range from about a few nanometers to a few hundred nanometers. FIG. 3B depicts a cross-sectional view of a typical wire grid 350 having wires 351 formed from a metal, such as aluminum.

Tables 1 and 2 below respectively set forth transmission (T), reflection (R) and absorption (A) characteristics of the wire grid 300 in FIG. 3A at a wavelength of 800 nm, and for the typical wire grid 350 in FIG. 3B. In Tables 1 and 2, both the wire grid 300 and the typical wire grid 350 are oriented for horizontal polarization. Similar characteristics may be obtained for wire grids oriented for vertical or diagonal polarization.

TABLE 1

| Polarization | T(%) | R(%) | A(%) |
|---|---|---|---|
| X | ~96 | 1 | ~3.5 |
| Y | ~0.5 | ~4 | ~95.5 |

TABLE 2

| Polarization | T(%) | R(%) | A(%) |
|---|---|---|---|
| X | ~96 | ~4 | ~0 |
| Y | ~1 | ~90 | ~9 |

Both Tables 1 and 2 show that the percentage transmission of horizontally polarized light (i.e., in the X direction) is about 96%, whereas the percentage of transmission of vertically polarized light (i.e., in the Y direction) is small (i.e., about 0.5% and about 1%). The percentage reflection of the horizontally polarized light is about 1% for the wire grid 300, and is about 4% for the typical wire grid 350. The percentage reflection is about 4% for the wire grid 300 having an MIM structure, whereas the percentage reflection for the typical wire grid 350 is about 90%. Thus, the MIM structure significantly reduces the amount of reflection in comparison to a typical wire grid. Further, the percentage absorption of light for the wire grid 300 having the MIM structure is about 3.5% in the X direction and about 95.5% in the Y direction. In contrast, the typical wire grid 350 exhibits virtually no absorption of light in the X direction and only about 9% in the Y direction. The significant reduction in reflection and the increase is absorption provided by the MIM structure may significantly reduce ghosting in a captured image.

Returning to FIG. 2A, the arrangement 200 of the four polarization filters 201*a*-201*d* and the four pixels 205-208 may be used to generate the following six polarization states for incident light.

$$I_H = I_H \tag{1}$$

$$I_V = I_V \tag{2}$$

$$I_D = I_D \tag{3}$$

$$I_A = I_H + I_V - I_D \tag{4}$$

$$I_R = I_H + I_V - I_L \tag{5}$$

$$I_L = I_L \tag{6}$$

in which $I_H$ is the light intensity parameter of horizontally polarized light (H) measured at pixel 205, $I_V$ is the light intensity parameter of the vertically polarized light (V) measured at pixel 206, $I_D$ is the light intensity parameter of the diagonally polarized light (D) measured at pixel 207, $I_A$ is the intensity parameter of the anti-diagonally polarized light, $I_R$ is the intensity parameter of the right-hand circularly polarized light, and $I_L$ is the light intensity parameter of the left-hand circularly polarized light (LHCP) measured at pixel 208.

Using the intensity parameters of Eqs. (1)-(6), the Stokes parameters $S_0$, $S_1$, $S_2$ and $S_3$ may be calculated as follows.

$$S_0 = I_H + I_V \tag{7}$$

$$S_1 = I_H - I_V \tag{8}$$

$$S_2 = 2 * I_D - S_0 \tag{9}$$

$$S_3 = 2 * I_L - S_0 \tag{10}$$

$$DoLP = \frac{\sqrt{S_1^2 + S_2^2}}{S_0} \tag{11}$$

$$AoLP = \frac{1}{2}\tan^{-1}\frac{S_2}{S_1} \tag{12}$$

in which $S_0$ is the total intensity of a light beam, DoLP is the degree of linear polarization, and AoLP is the angle of linear polarization, $E_{0x}$ is the magnitude of the electric field of the light in the x direction, $E_{0x}$ is the magnitude of the electric field of the light in the y direction, and δ is the angle of inclination of the electric field of the light with respect to the x-axis.

Figure 4A:
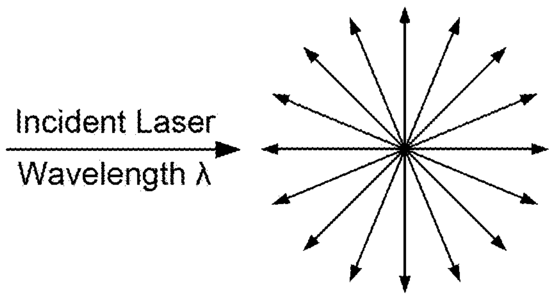
FIGS. 4A-4C conceptually depict how the size of a particle (nanostructure) may affect scattering of light.
Figure 4B:
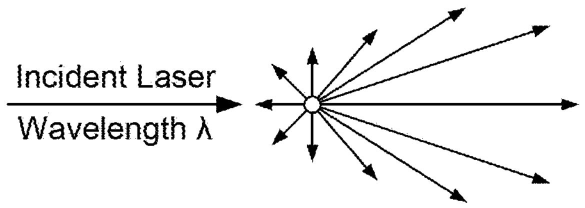
Figure 4C:
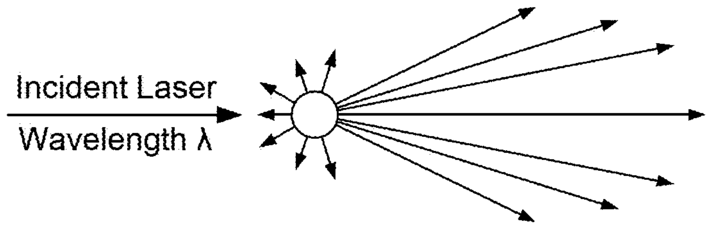

The size of the nanostructures 211 may affect how light passing through a polarization filter 201 may be scattered. FIGS. 4A-4C conceptually depict how the size of a particle (nanostructure) may affect scattering of light. FIG. 4A shows that if the size of a nanostructure is less than 0.10 of the wavelength λ of incident laser light (i.e., 0.1λ), the scattering of the light is Rayleigh scattering, which is elastic and is not angle dependent. FIG. 4B shows that if the size of a particle is greater than 0.10 of the wavelength λ (i.e., >0.1λ), the scattering of the light is Mie scattering, which is inelastic scattering and is angle dependent. FIG. 4C shows that as the size of a particle increases, the angle dependency of the Mie scattering increases.

Figure 5:
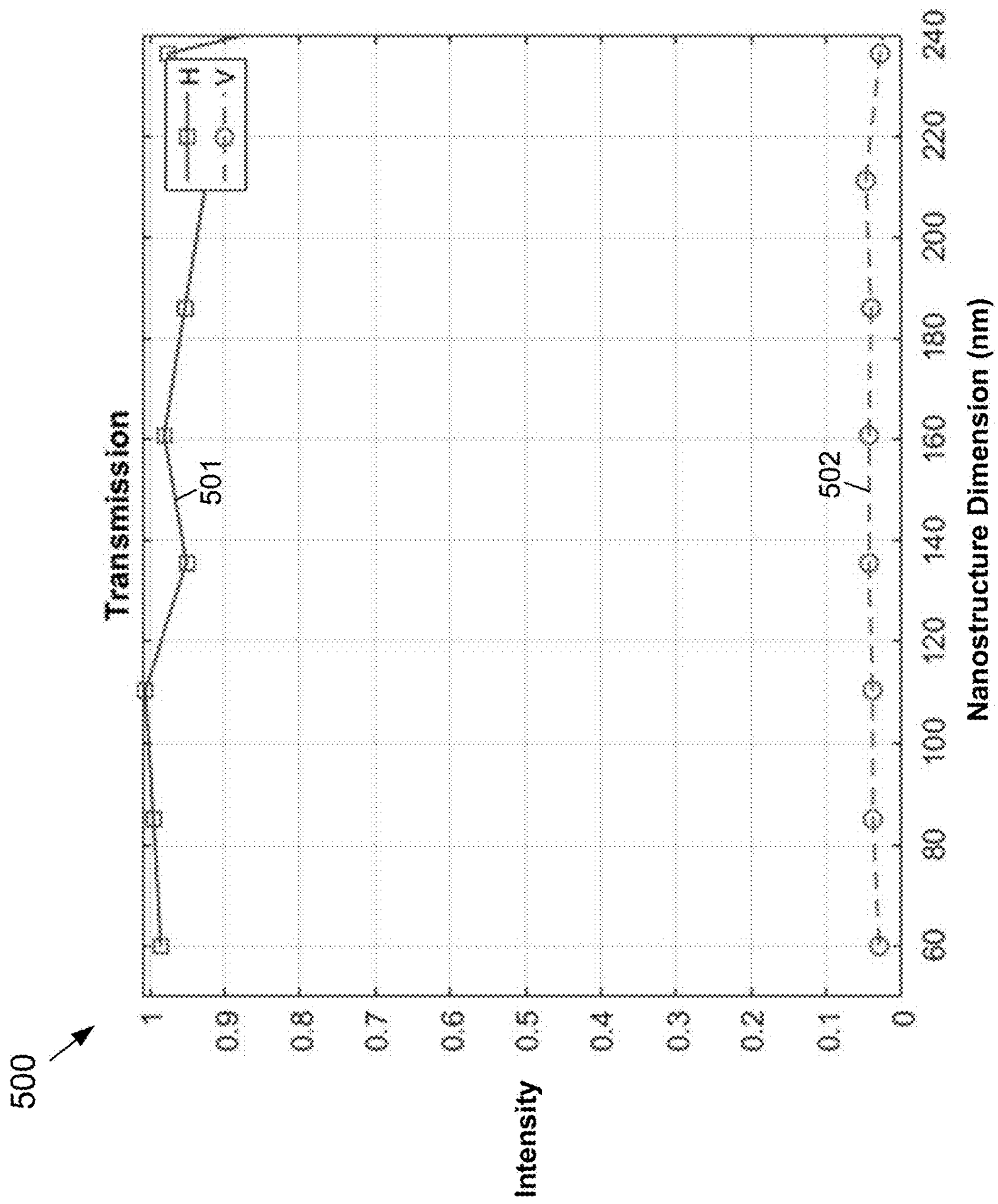
FIG. 5 shows a graph of transmission intensity as a function of Cartesian dimensions of a nanostructure according to the subject matter disclosed herein.

FIG. 5 shows a graph 500 of transmission intensity as a function of Cartesian dimensions of a nanostructure according to the subject matter disclosed herein. For a wide range of nanostructure dimensions, transmission intensity (curve 501) remains greater than 90% (i.e., greater than 0.9) for one linear polarization orientation, and less than 5% (i.e., less than 0.5) for the perpendicular polarization orientation (curve 502). Thus, for a wide range of nanostructure dimensions, scattering of light caused by the nanostructures 211 does not appreciably affect transmission of light through a polarization filter 201.

Figure 6:
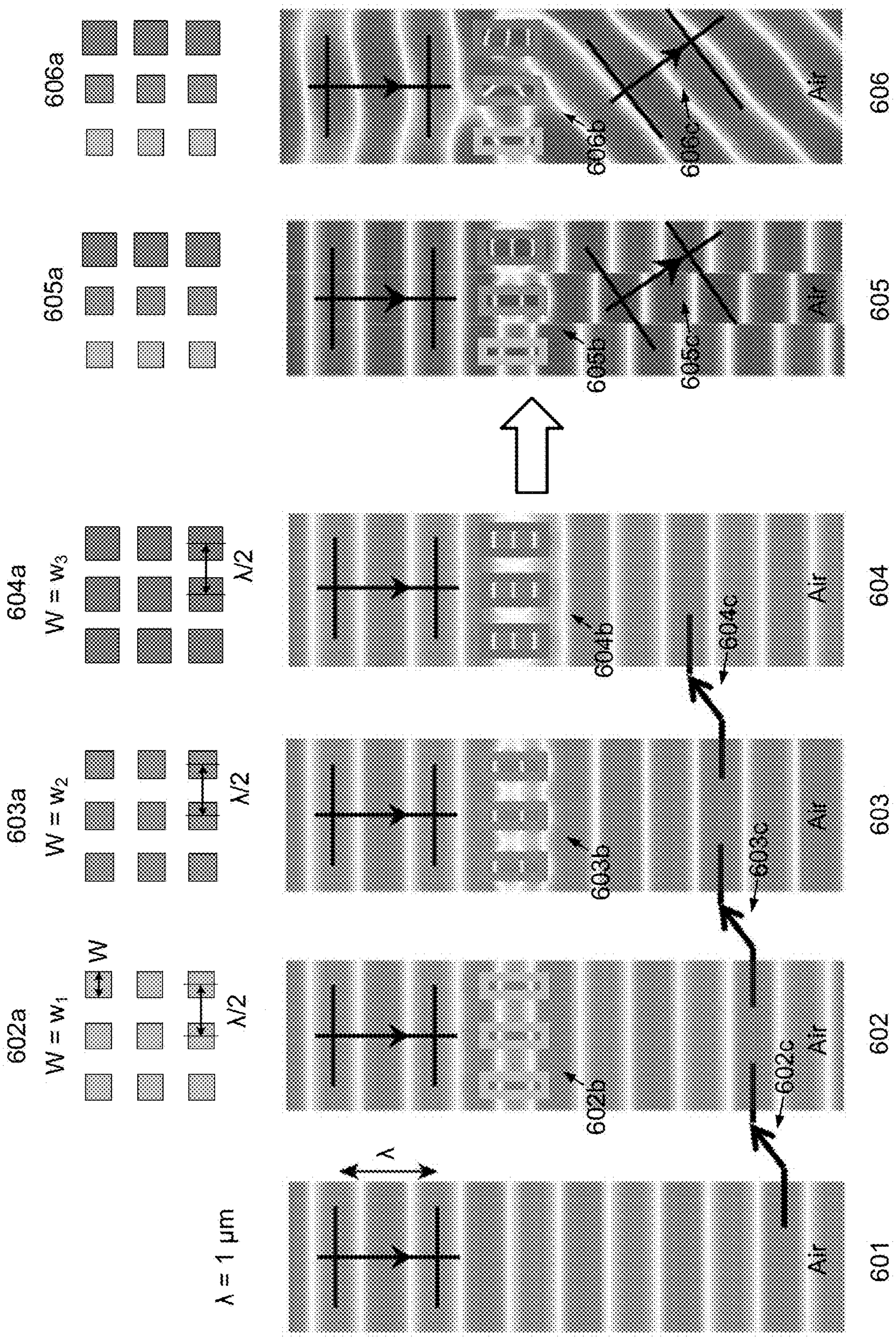
FIG. 6 conceptually depicts how changing dimensions of a nanostructure may be used to change the phase to focus incident light according to the subject matter disclosed herein.

The size and shape of the nanostructures 211 may be used to control, or modulate, the phase of light passing through a polarization filter 201. FIG. 6 conceptually depicts how changing dimensions of a nanostructure may be used to change the phase to focus incident light according to the subject matter disclosed herein. At 601, a baseline depiction of light having an example wavelength of λ=1 μm is shown as propagating in air in the direction indicated by the arrow. The light and dark gray areas along the path of propagation represent peaks and troughs of a wave model of the light. White areas represent zero crossings of the wave model. At 602, a change in phase of the light is shown that is caused by an array of square nanostructures 602*a* having a width W equal to $w_1$. The centers of the nanostructures 602*a* are positioned λ/2 of the light from each other. At 602*b*, the nanostructures are shown as being hollow to more clearly shown the phase of the light changes. It should be understood that the nanostructures are solid, as shown at 502*a*. The change of phase caused by the nanostructures 502*a* with respect to the baseline depiction 601 is indicated at 601*c*.

At 603, a change in phase of the light is shown that is caused by an array of square nanostructures 603*a* having a width W equal to $w_2$ in which $w_2>w_1$. The centers of the nanostructures 603*a* are positioned λ/2 of the light from each other. At 603*b*, the nanostructures are shown as being hollow to more clearly shown the phase of the light changes. It should be understood that the nanostructures are solid, as shown at 603*a*. The change of phase caused by the nanostructures 503*a* with respect to the phase change of the nanostructures 602 is indicated at 603*c*.

At 604, the change in phase of the light is shown that is caused by an array of square nanostructures 604*a* having a width W equal to $w_3$ in which $w_3>w_2>w_1$. The centers of the nanostructures 604*a* are positioned λ/2 of the light from each other. At 604*b*, the nanostructures are shown as being hollow to more clearly shown the phase of the light changes. It should be understood that the nanostructures are solid, as shown at 604*a*. The change of phase caused by the nanostructures 604*a* with respect to the phase of the nanostructures 603*a* is indicated at 604*c*.

The changes in phase provided by conceptual depictions at 601-604 may be used to focus the incident light. For example, at 605 a change in phase of the light is shown that is caused by an array of square nanostructures 605*a* having widths W equal to $w_1$, $w_2$ and $w_3$ and arranged as shown. At 605*b*, the nanostructures are shown as being hollow to more clearly shown the phase of the light changes. It should be understood that the nanostructures are solid, as shown at 605*a*. The change in phase caused by a nanostructure of a given size is depicted as discrete changes in phase at 605*c* for illustrative purposes.

At 606, a change in phase of the light is shown that is caused by an array of square nanostructures 606*a* having widths W equal to $w_1$, $w_2$ and $w_3$ arranged as shown. At 606*b*, the nanostructures are shown as being hollow to more clearly shown the phase of the light changes. It should be understood that the nanostructures are solid, as shown at 606*a*. The change in phase caused by a nanostructure of a given size ($W=w_1$, $w_2$ or $w_3$) is depicted as continuous changes in phase at 606*c*.

Figure 7B:
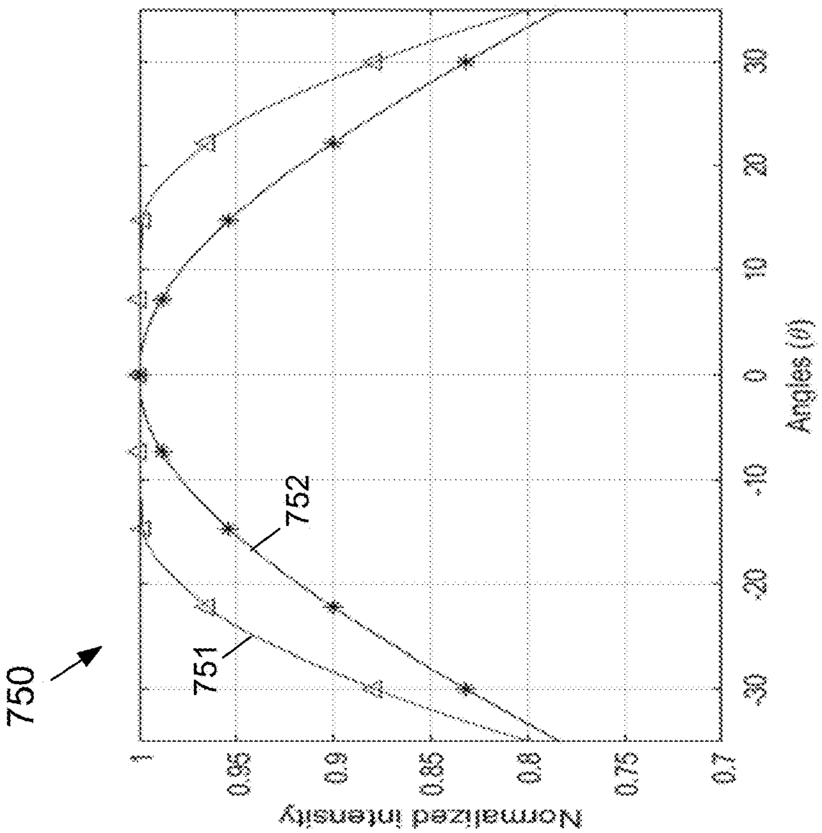
FIG. 7B is a graph of normalized intensity at a pixel as a function of the field of view angle of a polarized filter that includes nanostructures according to the subject matter disclosed herein.
Figure 7A:
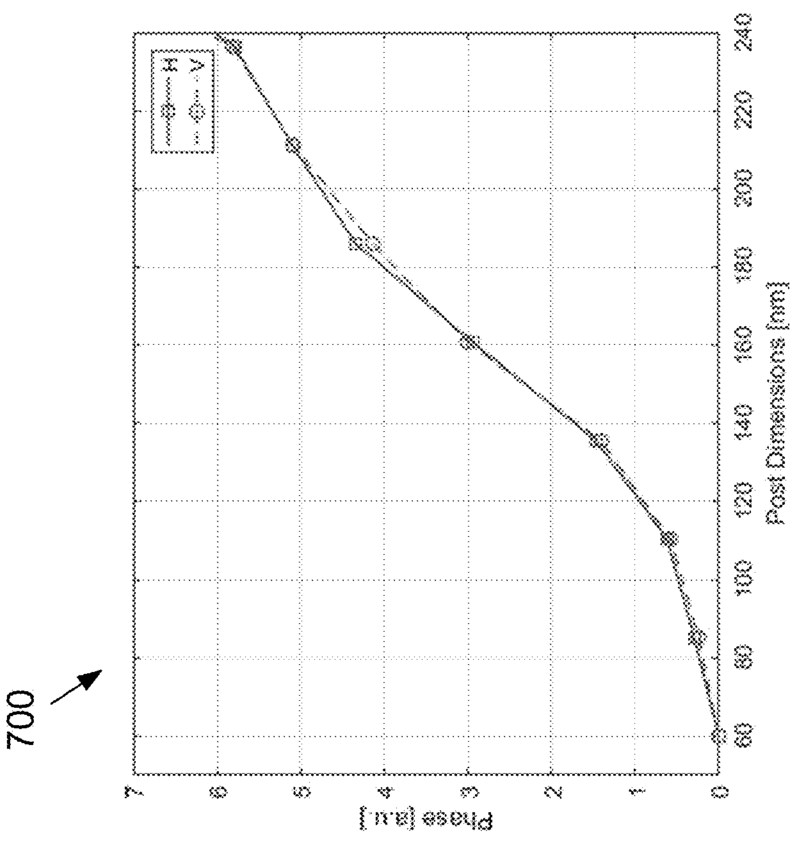
FIG. 7A is a graph of phase as a function of Cartesian dimensions of a nanostructure according to the subject matter disclosed herein.

FIG. 7A is a graph 700 of phase as a function of Cartesian dimensions of a nanostructure 211 according to the subject matter disclosed herein. The abscissa of graph 700 is the dimensions of a nanostructure in nm (also referred to a post dimensions). Phase for both horizontal (i.e., x) and vertical (i.e., y) dimensions are plotted. The ordinate of graph 700 is phase is in arbitrary units (a.u.). By changing the dimensions of the nanostructures, a full 2π phase shift may be obtained to change, or modulate, the wave front of the light for focusing purposes and for increasing angle-independence properties of a polarizing filter, thereby resulting in a greater efficiency of the pixels of an image sensor.

FIG. 7B is a graph 750 of normalized intensity at a pixel as a function of the field of view (FOV) angle of a polarized filter that includes nanostructures according to the subject matter disclosed herein. The abscissa of graph 750 is FOV angle in degrees and the ordinate is normalized intensity. The curve 751 represents the normalized intensity at a pixel, such as pixel 205, as a function of FOV angle of a polarized filter, such as polarization filter 201, which includes the nanostructures 211 that change, or modulate, the phase of the light to focus the light at the pixel. As can be seen, the curve 751 has a FOV of ±15 degrees, that is, a total FOV of 30 degrees, whereas as a comparison, curve 752 represents the normalized intensity at a pixel that is provided by a typical polarized filter that does not include phase-modulating nanostructures 211.

Figure 8B:
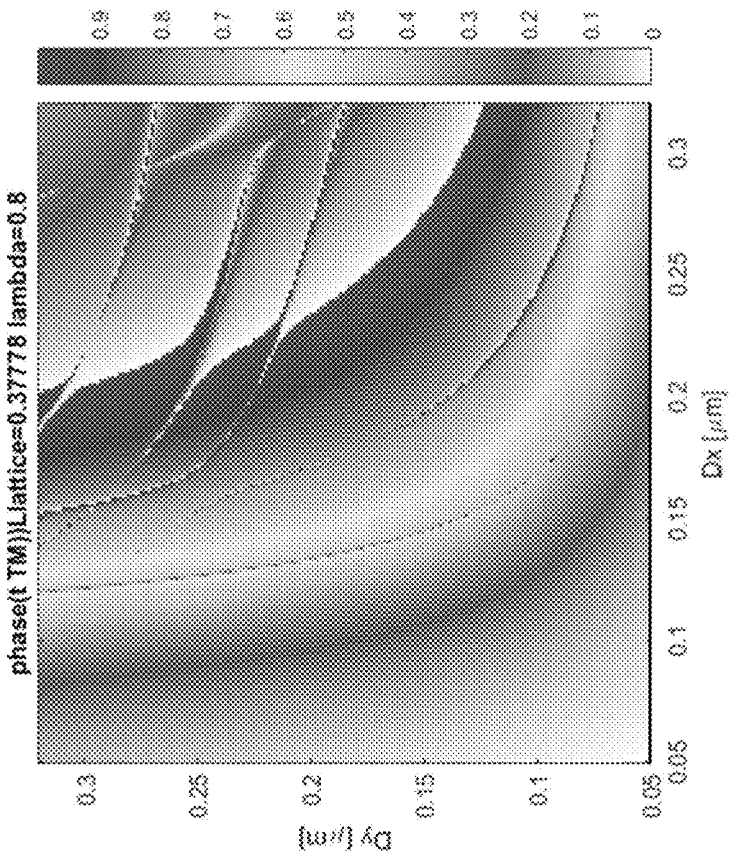
FIGS. 8A and 8B respective show example phase values for the transverse electric field and the transvers magnetic field for light having a wavelength of 0.8 μm for different width of x (Dx) and y dimensions (Dy) of a nanostructure according to the subject matter disclosed herein.
Figure 8A:
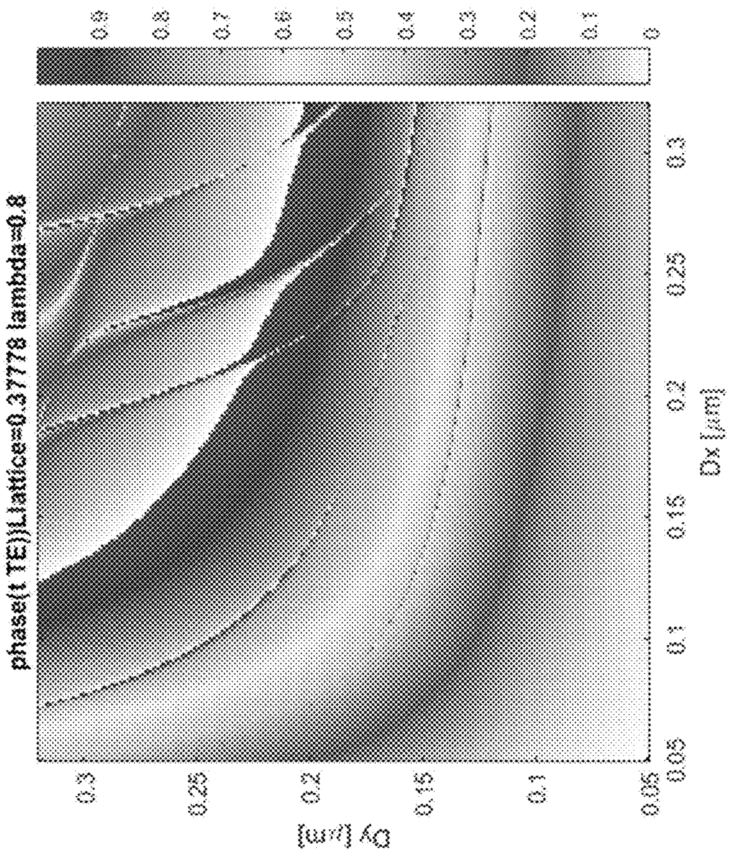

FIGS. 8A and 8B respective show example phase values for the TE field and the TM field for light having a wavelength of 0.8 μm for different x and y dimensions of a nanostructure according to the subject matter disclosed herein. The abscissas of FIGS. 8A and 8B are the x dimension of a nanostructure (in μm), and the ordinates are the y dimension of a nanostructure (in μm). The normalized phase with respect to 2π radians is indicated as a shade of gray. The term "Llattice=0.37778 indicates the pitch of single nanostructure is 0.37778 μm for the simulations shown in FIGS. 8A and 8B. If, for example, the pixel size is 3.4 μm, then there will be 9×9 nanostructures in one pixel, and 9 times 0.37778 μm equals 3.4 μm.

Figure 8C:
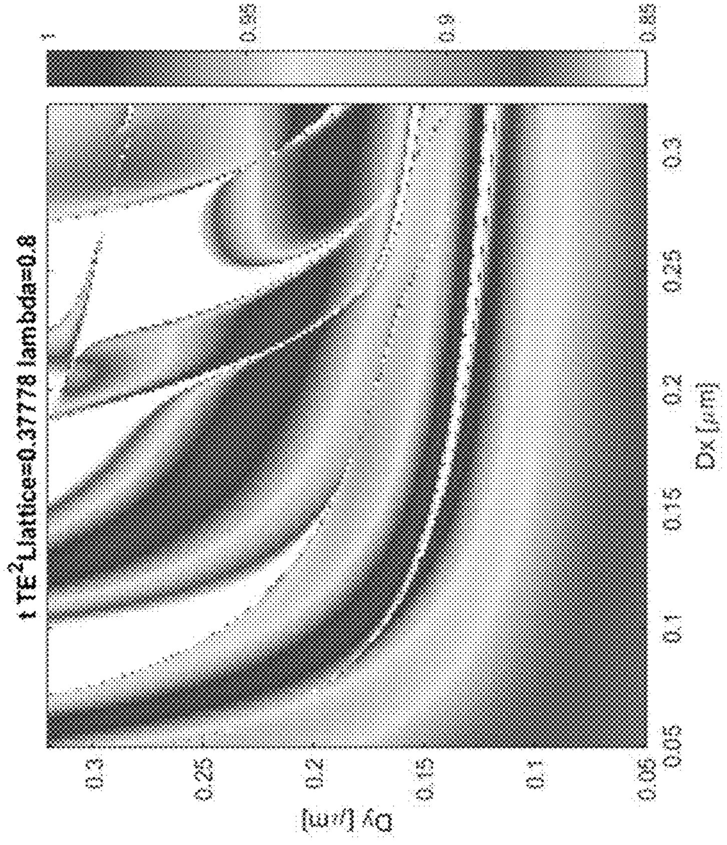
FIGS. 8C and 8D respective show example transmission coefficient or amplitude values for the transverse electric field and the transverse magnetic field for light having a wavelength of 0.8 μm for different width of x (Dx) and y dimensions (Dy) of a nanostructure according to the subject matter disclosed herein.
Figure 8D:
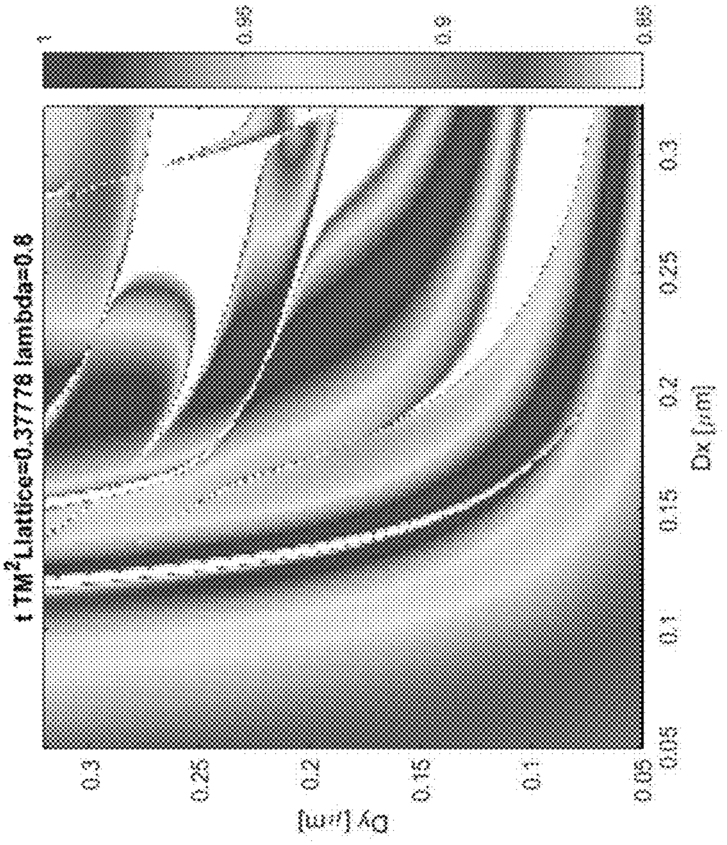

FIGS. 8C and 8D respective show example transmission intensity values for the TE field and the TM field for light having a wavelength of 0.8 μm for different x and y dimensions of a nanostructure according to the subject matter disclosed herein. The abscissas of FIGS. 8C and 8D are the x dimension of a nanostructure (in μm), and the ordinates are the y dimension of a nanostructure (in μm). Intensity values are indicated by shades of gray.

Figure 9:
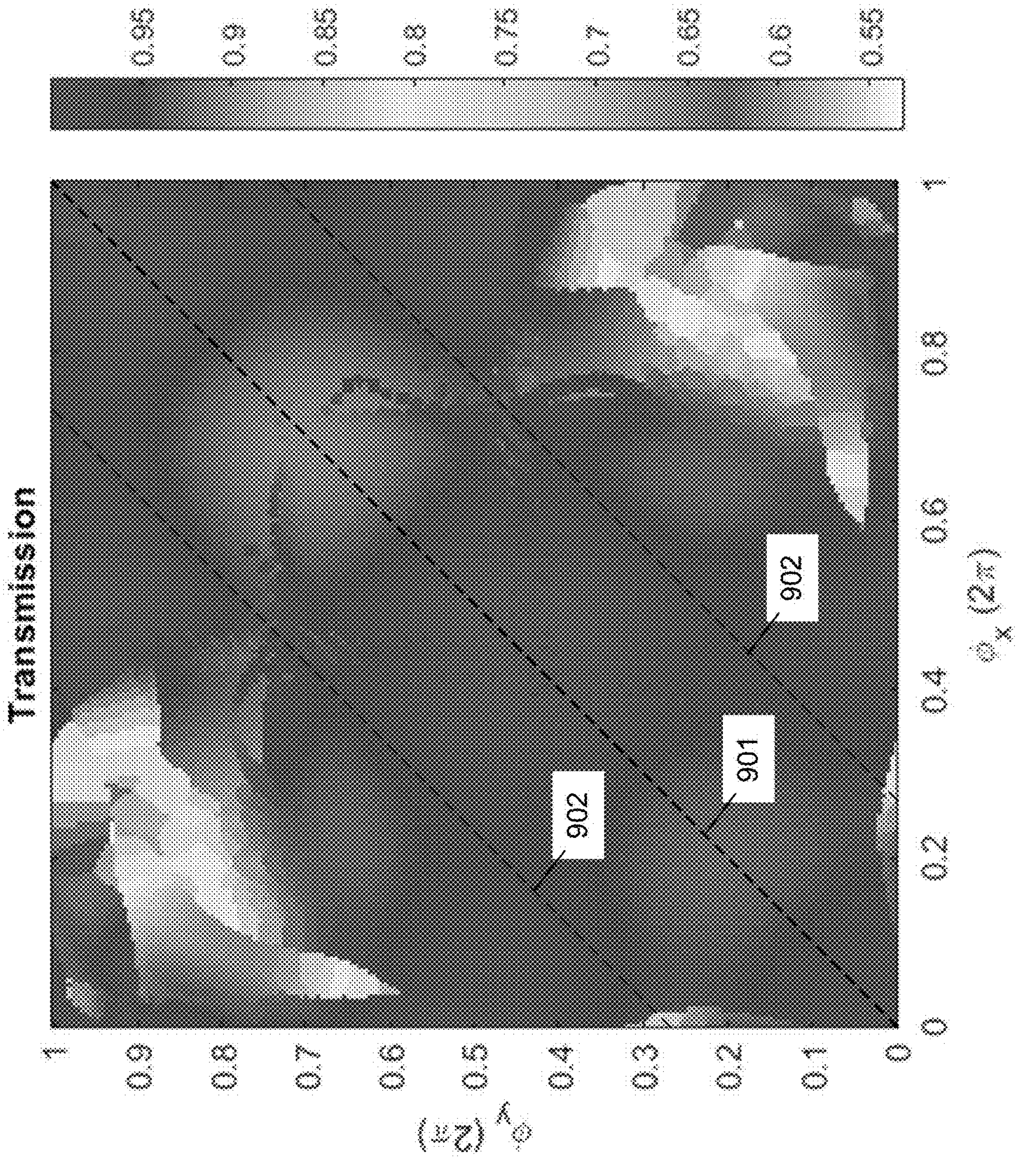
FIG. 9 is a graph of the total transmission coefficient or amplitude values with respect to different phase values $\varphi_x$ and $\varphi_y$ introduced from nanostructures with width of Dx and Dy according to the subject matter disclosed herein.

FIG. 9 is a graph of the total transmission coefficient values in the $\varphi_x$ and the $\varphi_y$ plane. In FIG. 9, the coefficient values for the total transmission T are determined as $$T = \frac{1}{2}\left(T_{TE}^2 + T_{TM}^2\right) \tag{13}$$

in which $T_{TE}$ is the transmission coefficient for the TE field and $T_{TM}$ is the transmission coefficient for the TM field. The total transmission coefficient values are indicated by shades of gray. In FIG. 9, the line of equal phase is indicated at 901, and the lines for a 90° phase shift for a QWP are indicated at 902.

Figure 10:
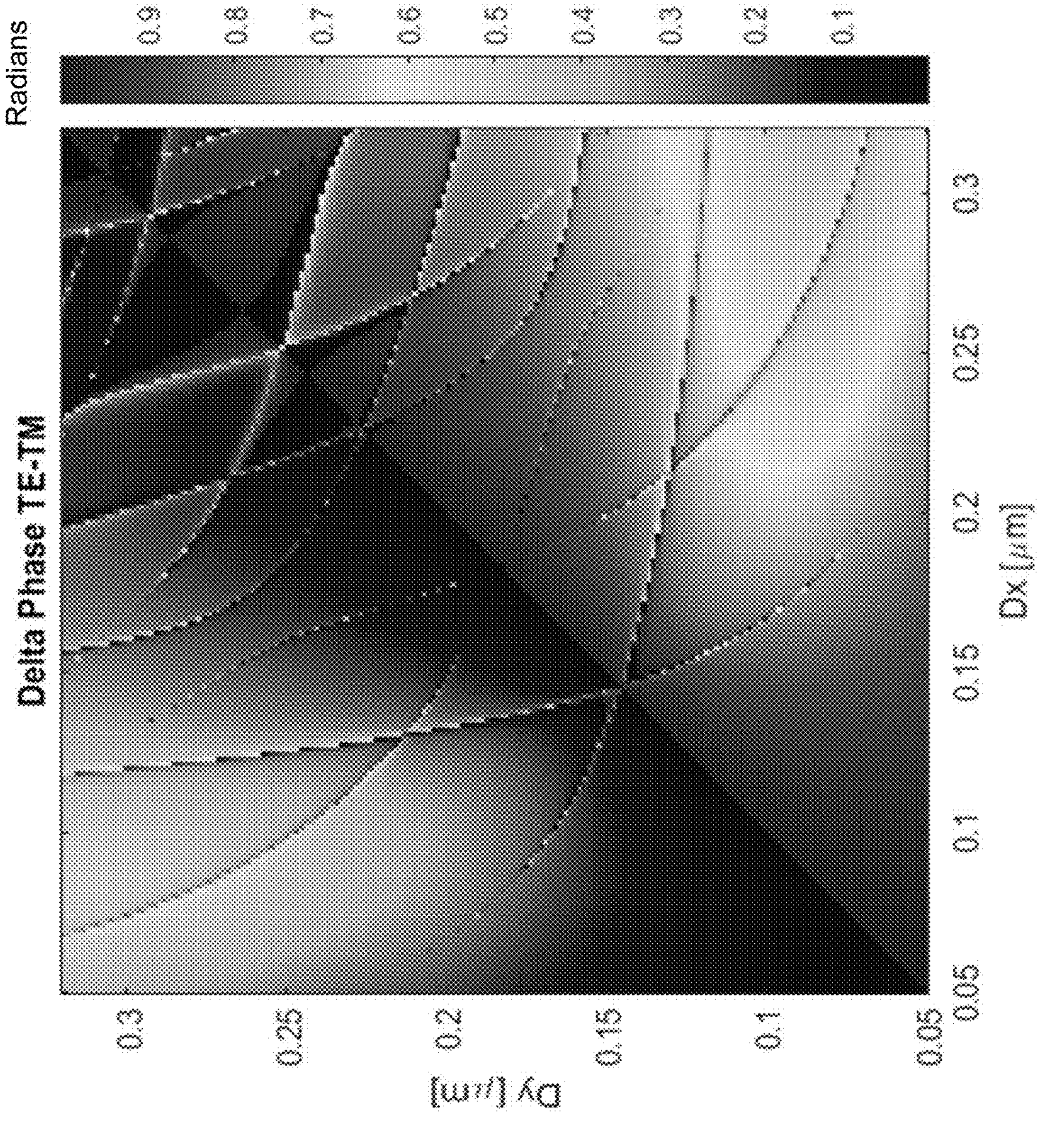
FIG. 10, which may be derived from FIGS. 8A and 8B, shows the phase difference ($\varphi_x-\varphi_y$) introduced from nanostructures with widths of Dx and Dy for different x and y dimensions according to the subject matter disclosed herein.

Two types of QWPs may be designed using the nanostructures disclosed herein for respectively detecting right and left circularly polarized light. In the first type of QWP design, the phase of the TE field leads to the phase of the TM field by π/2 radians. In the second type of QWP design, the phase of the TE field lags the phase to the TM field by π/2 radians. FIG. 10 shows the phase difference for different x and y dimensions of a nanostructure. The abscissa of FIG. 10 is $D_x$ in μm, and the ordinate of FIG. 10 is $D_y$ in μm. The phase difference normalized with 2π radians is indicated by a shade of gray.

Figure 11A:
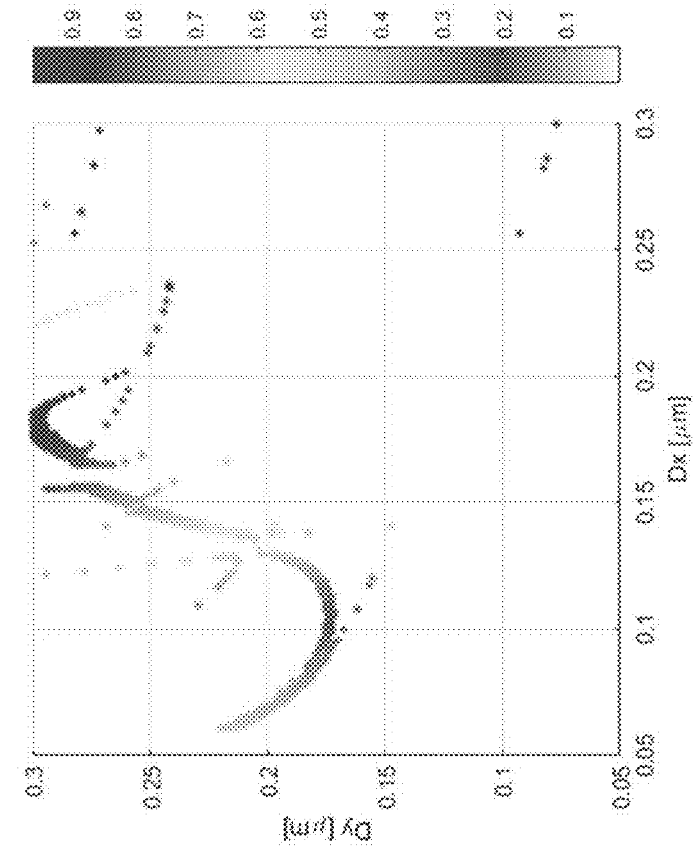
FIGS. 11A and 11B respectively show smoothed and individual points excluding discretization errors extracted from FIG. 10 for phase difference ($\varphi_x-\varphi_y$) of $\pi/2$ radians.
Figure 11B:
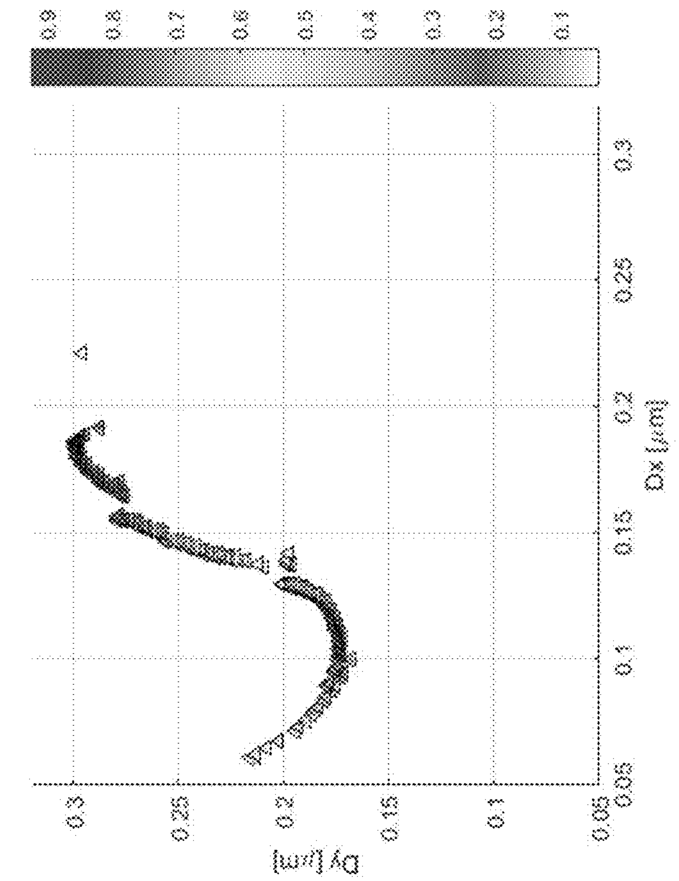
Figure 11D:
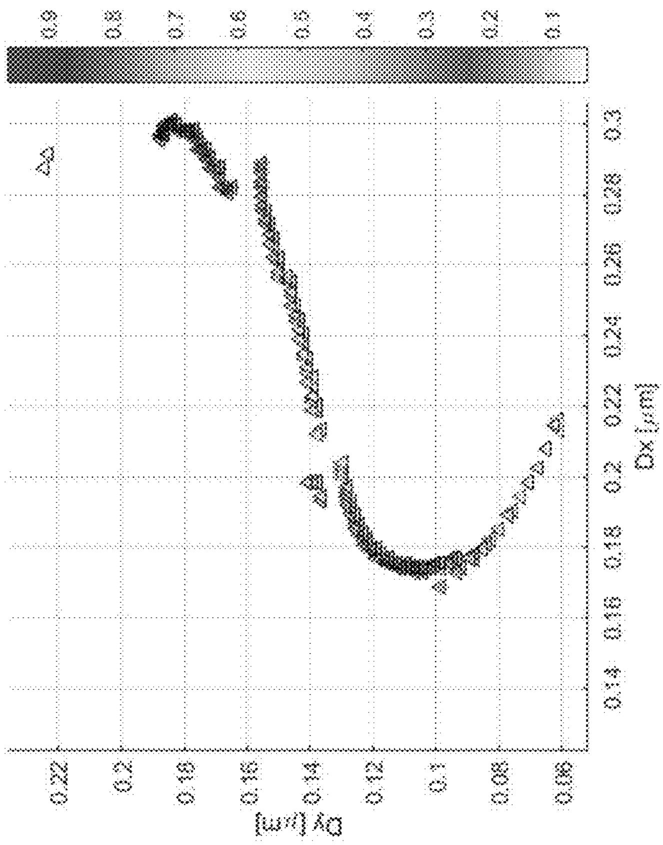
FIGS. 11C and 11D respectively show smoothed and individual points excluding discretization errors extracted from FIG. 10 for phase difference ($\varphi_x-\varphi_y$) of $-\pi/2$ radians.
Figure 11C:
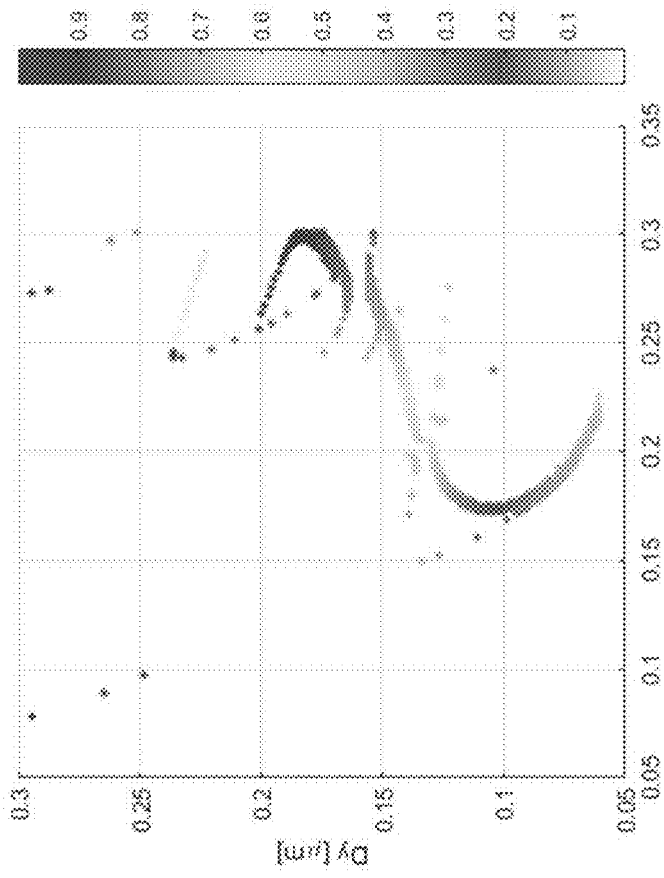

A tolerance may be expected in finding the values for π/2. FIGS. 11A and 11B respectively show smoothed and individual points excluding discretization errors for the TM field for the first type of QWP design in which the phase of the TE field leads to the phase of the TM field by π/2 radians to determine the Dx and Dy values. FIGS. 11C and 11D respectively show smoothed and individual points excluding discretization errors for the TE field for the first type of QWP design in which the phase of the TE field lags to the phase of the TM field by π/2 radians. The magnitude of the discretization error is indicated by a shade of gray.

Figure 12B:
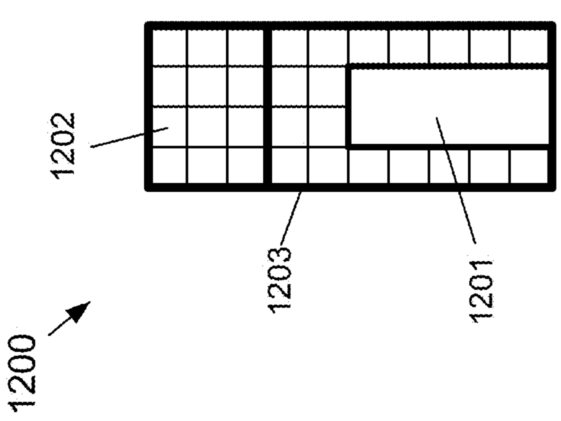
FIGS. 12A and 12B respectively show the top and side views of nanostructures for a unit cell size of the circular polarization detecting pixel according to the subject matter disclosed herein.
Figure 12A:
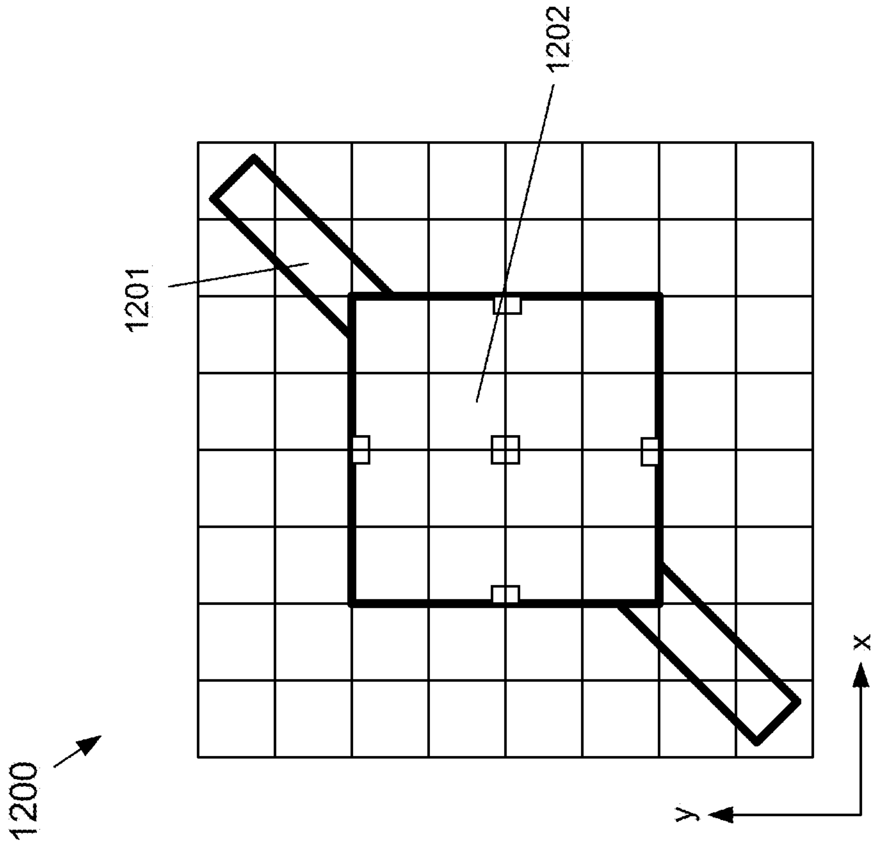

FIGS. 12A and 12B respectively depict top and side views of a unit cell example nanostructure 1200 together with metal wire grids and phase modulating metasurface for a 9×9 arrangement of nanostructures designed to operate as simultaneously a QWP, a focusing lens and linear polarization detection according to the subject matter disclosed herein. The unit cell nanostructure 1200 includes a wire grid 1201, a metasurface 1202 and a capping layer 1203. The dimension of the metasurface nanostructures for unit cell Dx may be selected to be 2×106 nm, and the dimension Dy was selected to be 2×68.9 nm, which may be extracted from FIG. 11D. Table 3 shows the simulated transmission and reflection properties of the example nanostructure for RHCP light and LHCP light.

TABLE 3

| Polarization | Transmission | Reflection |
|---|---|---|
| RHCP | 0.841 | 0.129 |
| LHCP | 0.0235 | 0.684 |

Figure 13B:
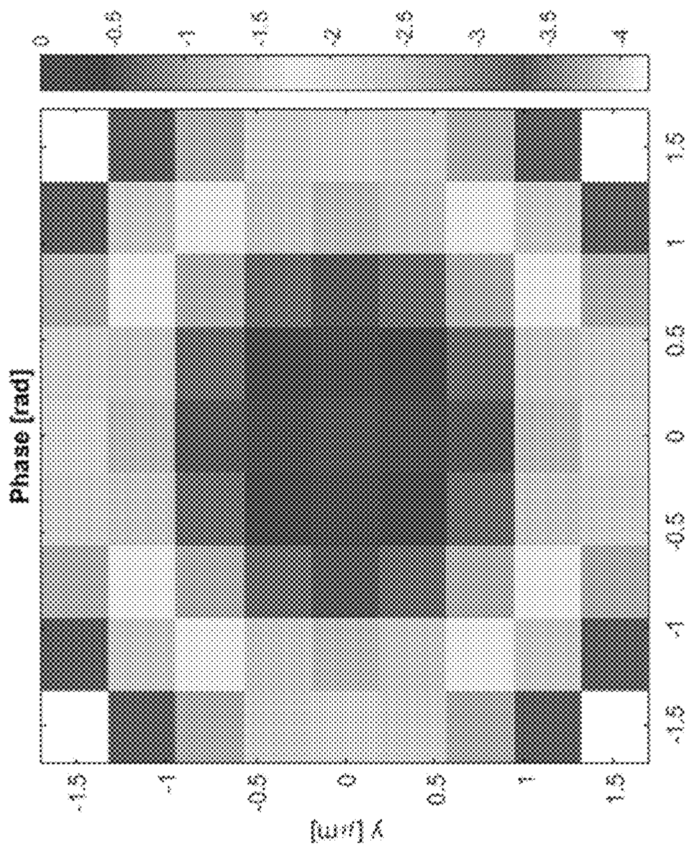
FIGS. 13A and 13B respectively show the smooth and discrete phase maps needed to focus the light from the nanostructures to the photodiode of the sensor according to the subject matter disclosed herein.
Figure 13A:
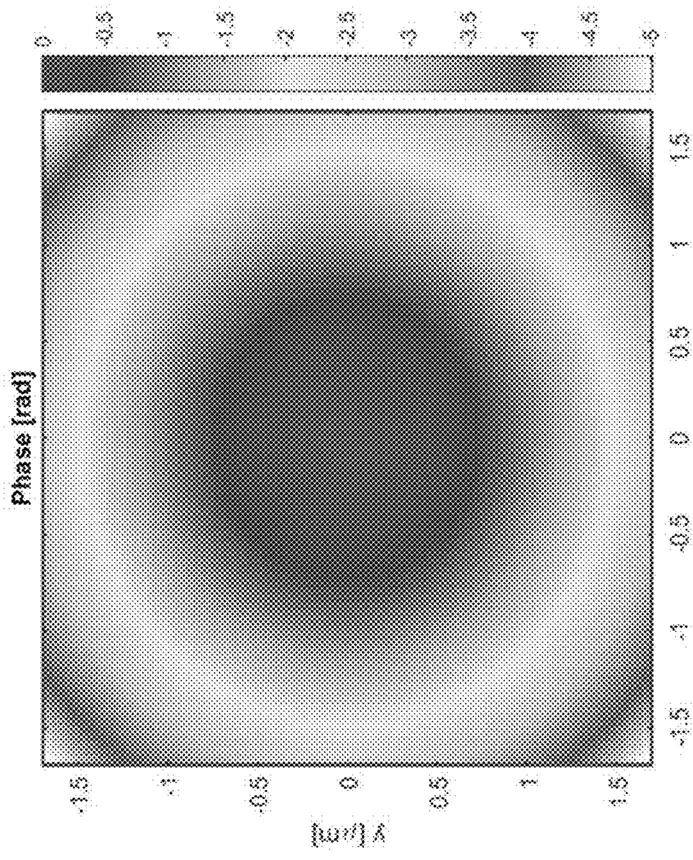

FIG. 13A shows the theoretical phase map of the nanostructures needed to focus the light to the photodiode of the sensor. The hyperbolic phase needed for focusing a normal incident light to a pixel may be given by $$\phi(\rho) = -\frac{2\pi}{\lambda}\left(\sqrt{\rho^2 + f^2} - f\right) \tag{14}$$

in which ρ is the radial coordinate and f is the distance between the metasurface and the photodiode.

FIG. 13B shows the discrete version of the phase map shown in the FIG. 13A based on a unit cell of the nanostructure. For example, the phase map here is divided into 9×9 arrangements to assign each block with a nanostructure with defined phase values.

Figure 14A:
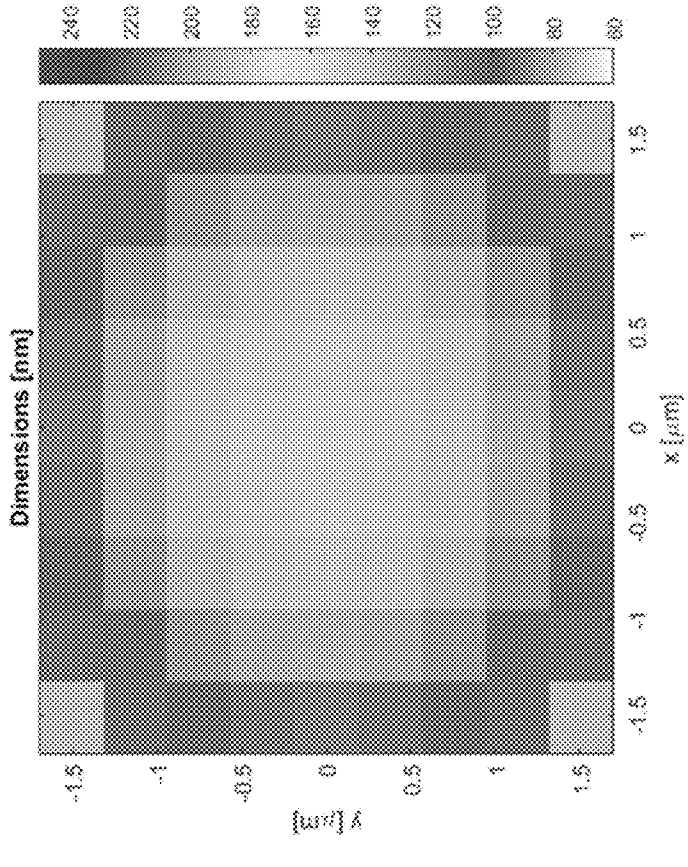
FIGS. 14A and 14B show the nanostructure dimension requirements to achieve the phase map in FIG. 13B for focusing light in the case of Dx=Dy and the resultant focused light on the photodiode according to the subject matter disclosed herein.
Figure 14B:
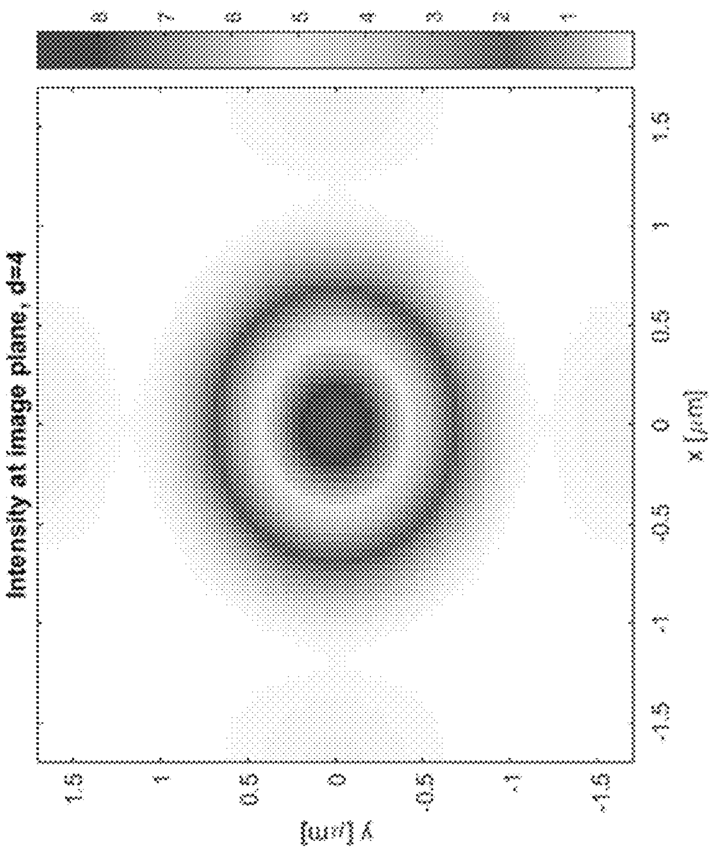

FIG. 14A shows the nanostructure dimension requirements to achieve the phase map in FIG. 13B. The values of the nanostructure dimension may be extracted from FIG. 7A. This design is valid for the case of Dx=Dy, i.e., to design the linear polarization pixel $I_H$, $I_V$, $I_D$ and $I_D$. FIG. 14B shows the simulated focused light beam on the photodetector from the designed nanostructure arrangement in FIG. 14A.

Figure 15B:
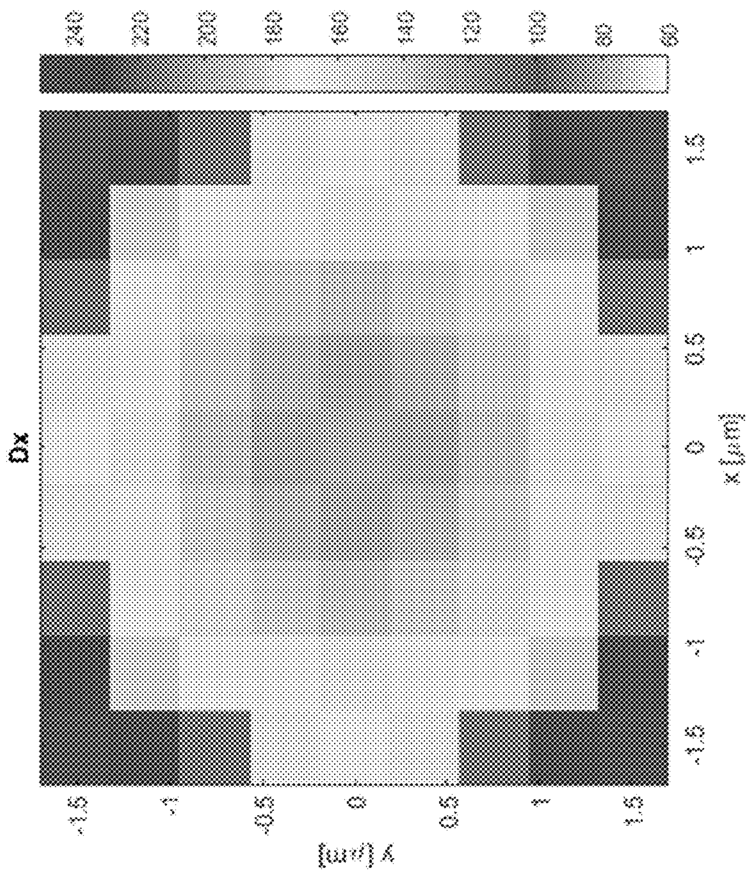
FIGS. 15A and 15B show the nanostructure dimension requirements to achieve the phase map in FIG. 13B for focusing light in the case of Dx≠Dy according to the subject matter disclosed herein.
Figure 15A:
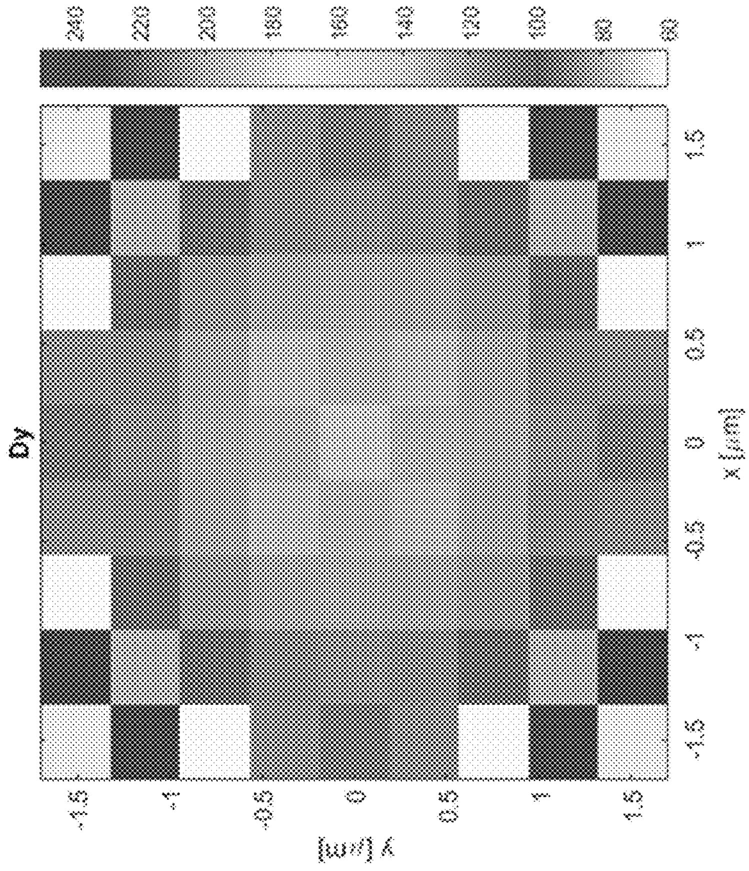

FIGS. 15A and 15B show the nanostructure dimension requirements for both Dx and Dy to achieve the phase map in FIG. 13B. The values of the nanostructure dimension may be extracted from FIG. 7A. This design is valid for the case of Dx≠Dy, i.e., to design the QWP and circular polarization pixel $I_R$ and $I_L$.

Figure 16:
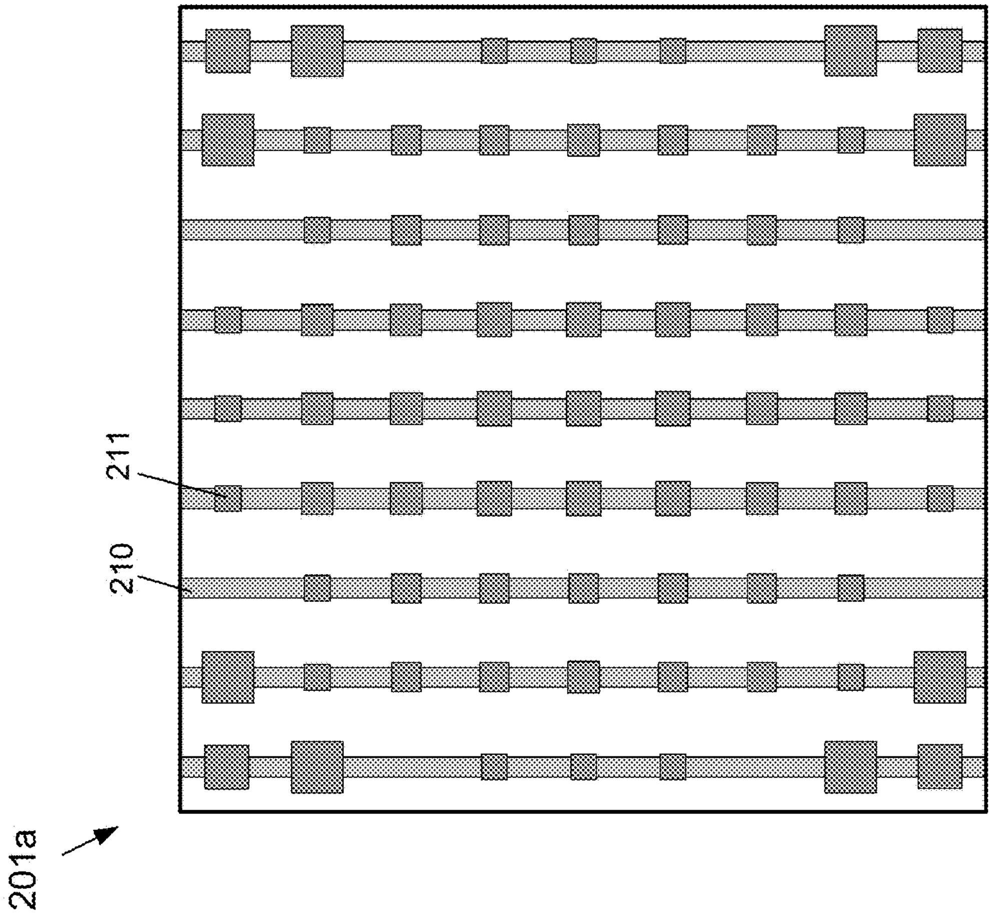
FIG. 16 depicts an example arrangement of a wire grid and nanostructures for the multifunctional horizontally polarization filter in FIG. 2A according to the subject matter disclosed herein.

FIG. 16 depicts an example arrangement of a wire grid 210 and nanostructures 211 for the multifunctional horizontally (H) polarization filter 201_a_ in FIG. 2A according to the subject matter disclosed herein. Only one wire of the wire grid 210 is indicated, and only one nanostructure 211 is indicated. The sizes of the nanostructures 211 have been selected using the techniques disclosed herein so that light passing through the filter 201_a_ is focused at a pixel at an image plane (i.e., pixel 205 in FIG. 2A). The example arrangement depicted in FIG. 16 may be rotated to the right (or left) to provide an arrangement of a wire grid 210 and nanostructure 211 for the multifunctional vertically polarization filter 201_b_ in FIG. 2A.

Figure 17:
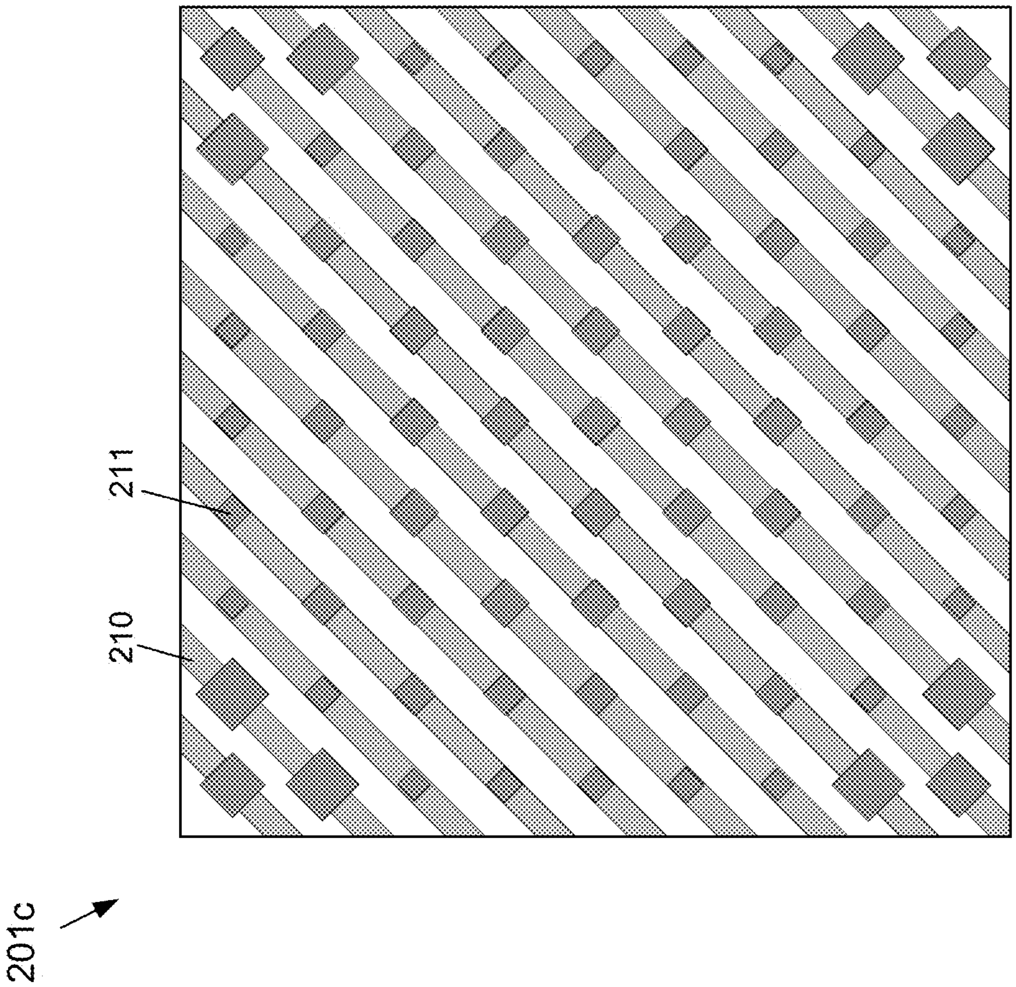
FIG. 17 depicts an example arrangement of a wire grid and nanostructure for the multifunctional diagonal polarization filter of FIG. 2A according to the subject matter disclosed herein.

FIG. 17 depicts an example arrangement of a wire grid 210 and nanostructure 211 for the multifunctional diagonal (D) polarization filter 201_c_ of FIG. 2A according to the subject matter disclosed herein. Only one wire of the wire grid 210 is indicated, and only one nanostructure 211 is indicated. The sizes of the nanostructures 211 have been selected using the techniques disclosed herein so that light passing through the filter 201_c_ is focused at a pixel at an image plane (i.e., pixel 207 in FIG. 2A). The example arrangement depicted in FIG. 17 may be rotated to the right (or left) to provide an arrangement of a wire grid 210 and nanostructure 211 for a multifunctional anti-diagonal (A) polarization filter 201.

Figure 18:
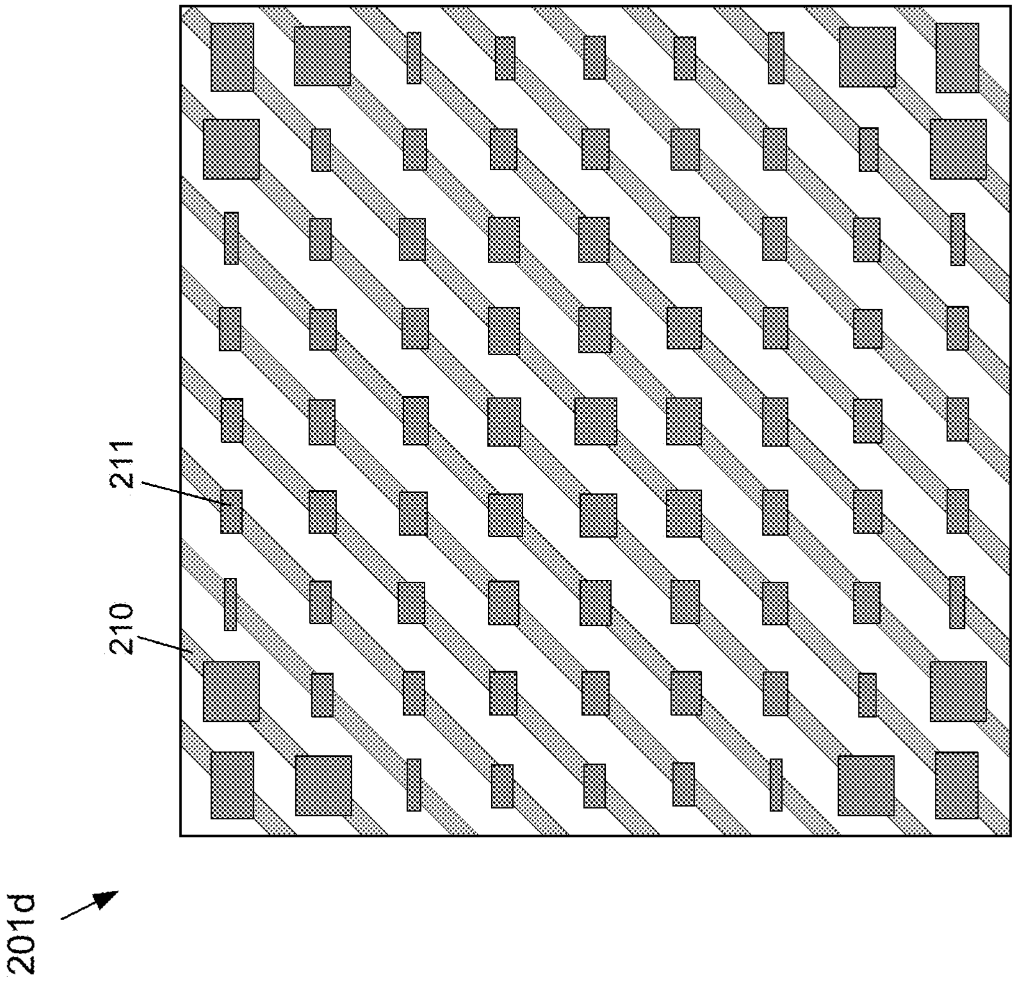
FIG. 18 depicts an example arrangement of a wire grid and nanostructure for the multifunctional left-hand circular polarized polarization filter of FIG. 2A according to the subject matter disclosed herein.

FIG. 18 depicts an example arrangement of a wire grid 210 and nanostructure 211 for the multifunctional LHCP polarization filter 201_d_ of FIG. 2A according to the subject matter disclosed herein. Only one wire of the wire grid 210 is indicated, and only one nanostructure 211 is indicated. The sizes of the nanostructures 211 have been selected using the techniques disclosed herein so that light passing through the filter 201_c_ is focused at a pixel at an image plane (i.e., pixel 208 in FIG. 2A). The example arrangement depicted in FIG. 17 may be rotated to the right (or left) to provide an arrangement of a wire grid 210 and nanostructure 211 for a multifunctional RHCP polarization filter 201.

Figure 19:
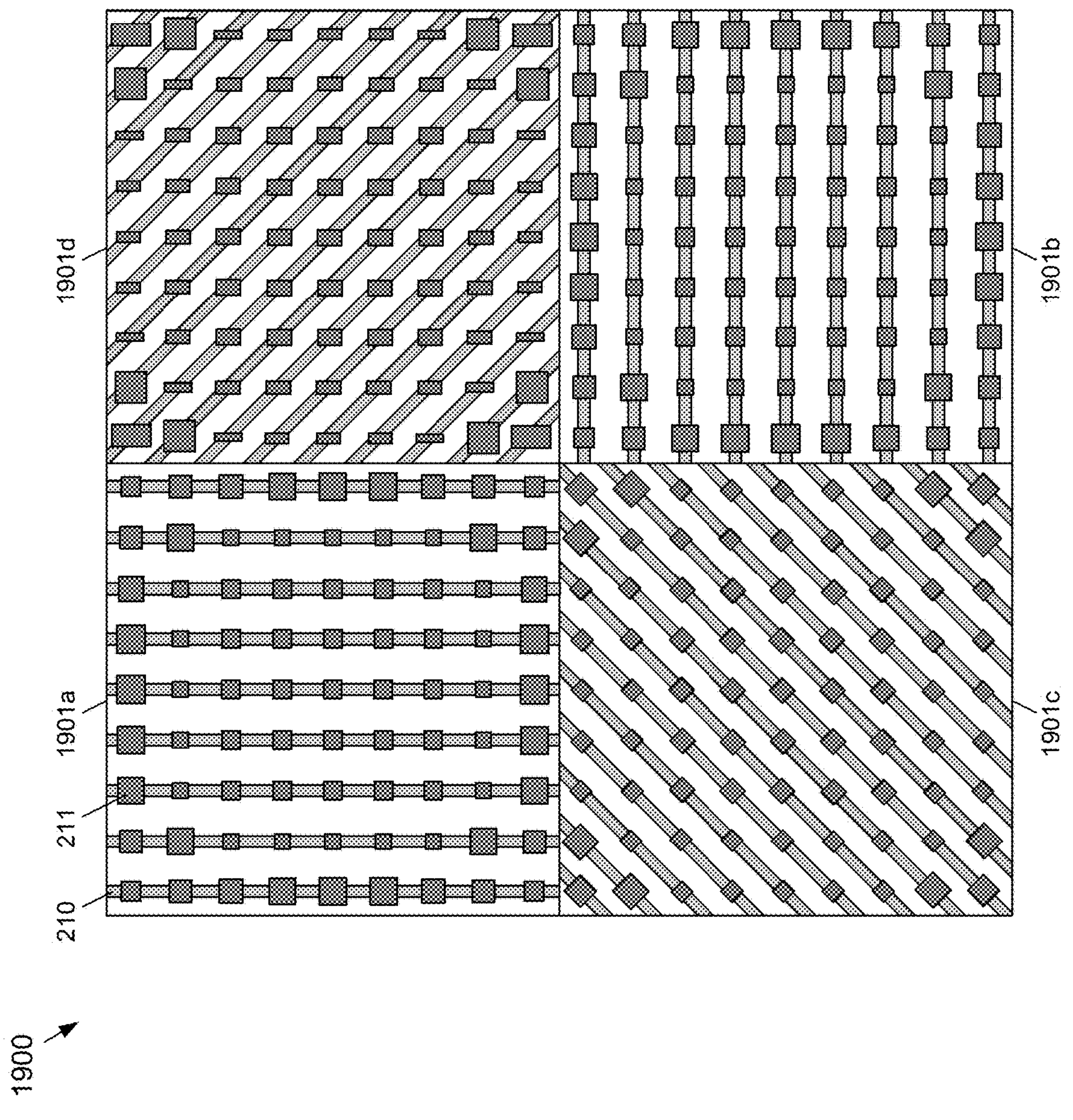
FIG. 19 depicts an example embodiment of a multifunctional polarization filter for a unit-cell pixel according to the subject matter disclosed herein.

FIG. 19 depicts an example embodiment of a multifunctional polarization filter 1900 for a unit-cell pixel according to the subject matter disclosed herein. The multifunctional polarization filter 1900 may be used to detect six polarization states according to the subject matter disclosed herein. The polarization filter 1900 includes a filter 1901_a_ that horizontally (H) polarizes light passing through the filter 1901_a_, a filter 1901_b_ that vertically (V) polarizes light passing through the filter 1901_b_, a filter 1901_c_ that diagonally (D) polarizes light passing through the filter 1901_c_, and a filter 1801_d_ that circularly polarizes light passing through the filter 1901_d_.

Each of the filters 1901_a_-1901_d_ includes a wire grid 210 having an MIM structure and one or more phase-modulating nanostructures 211, although the wire grid and the phase-modulating nanostructures are only indicated for the filter 1901_a_. The size and shapes of the nanostructures 211 are selected as described herein to focus light passing through each filter onto a location on an image plane that corresponds to a pixel of a unit-cell pixel (not shown). For example, the horizontal and vertical dimensions of the phase-modulating nanostructures 211 may be varied based on the graph 700 in FIG. 7A to achieve a desired focusing. For example, the phase-modulating nanostructures 211 are depicted as being generally square for the polarizing filters 1901_a_-1901_d_, but having different horizontal and vertical dimensions depending upon the position of the nanostructure on the polarizing filter. The phase-modulating nanostructures of the circularly polarizing filter 1901_d_ may be generally square or rectangular depending upon the position of the nanostructure on the polarizing filter.

The arrangement of the polarization filters 1901_a_-1901_d_, in which the horizontally polarization filter 1901_a_ is in the upper-left corner of the polarization filter 1900, the vertically polarization filter 1901_b_ in the lower-right corner, the diagonally polarization filter 1901_c_ in the lower-left corner, and the circularly polarization filter 1901_d_ is in the upper-right corner, is an example arrangement and other arrangements are possible. In an alternative example embodiment, two additional polarization filters, such as an anti-diagonally polarization filter and a circularly polarization filter that would polarize light in the opposite circular direction from the circularly polarization filter 1901_d_, may be included in the polarization filter 1900. Such an alternative embodiment would also use two additional pixels in a unit-cell pixel.

Figure 20E:
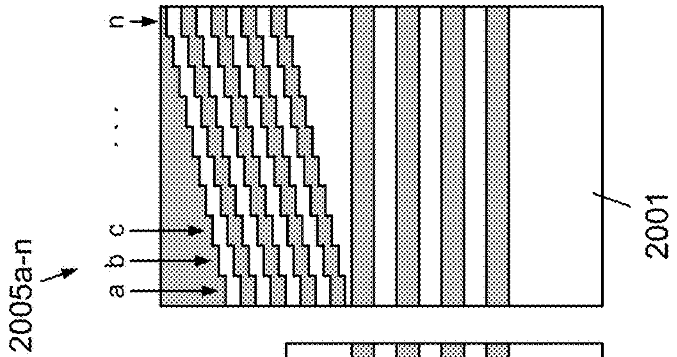
FIGS. 20A-20E depict a cross-sectional view of an example sequence of forming different spectral filters on an array of photodiodes according to the subject matter disclosed herein.
Figure 20D:
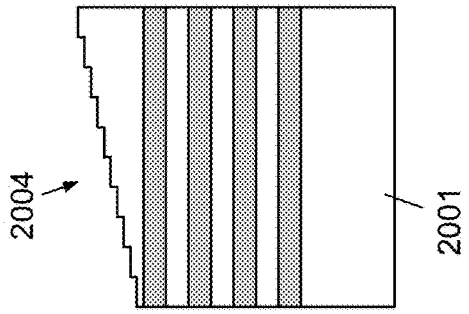
Figure 20C:
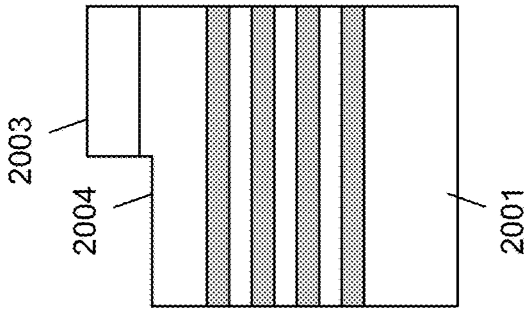
Figure 20B:
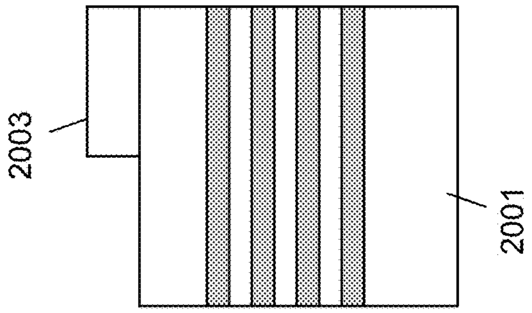
Figure 20A:
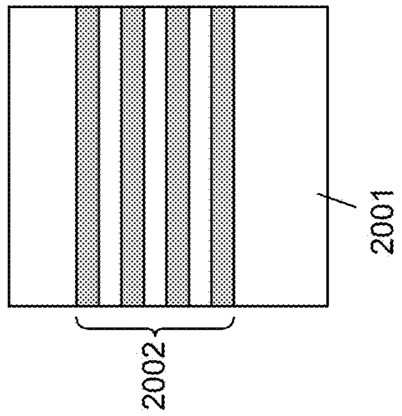

Different spectral filters may be positioned in alignment with, for example, one or more polarizers 201, so that the Stokes parameters may be determined for light of different spectral ranges. FIGS. 20A-20E depict a cross-sectional view of an example sequence of forming different spectral filters on an array of photodiodes according to the subject matter disclosed herein. The polarizers 201 are not shown in FIGS. 20A-20E; however, the polarizers 201 may be placed on either side of the spectral filters in the light path. In FIG. 20A, a bottom distributed Bragg reflector (DBR) 2002 is formed on a substrate 2001 that includes an array of photodiodes (not shown). In one embodiment, the bottom DBR 2002 may be formed from alternating layers of $SiO_2$ and $TiO_2$. In FIGS. 20B-20D, photolithography and patterned masks 2003 may be used to form layers and/or cavities 604 having different heights, or thicknesses, that reflect correspondingly different wavelengths of light to form spectral filters 2005*a-n*, as depicted in FIG. 20E. Each respective spectral filter may be arranged to be aligned with a polarizer 201 and a photodetector. It should be understood that the depiction of the spectral filters 2005*a-n* in FIG. 20E is in only one direction or dimension. A cross-sectional view in another orthogonal direction may depict one or more additional spectral filters each covering a different spectral range.

Figure 21:
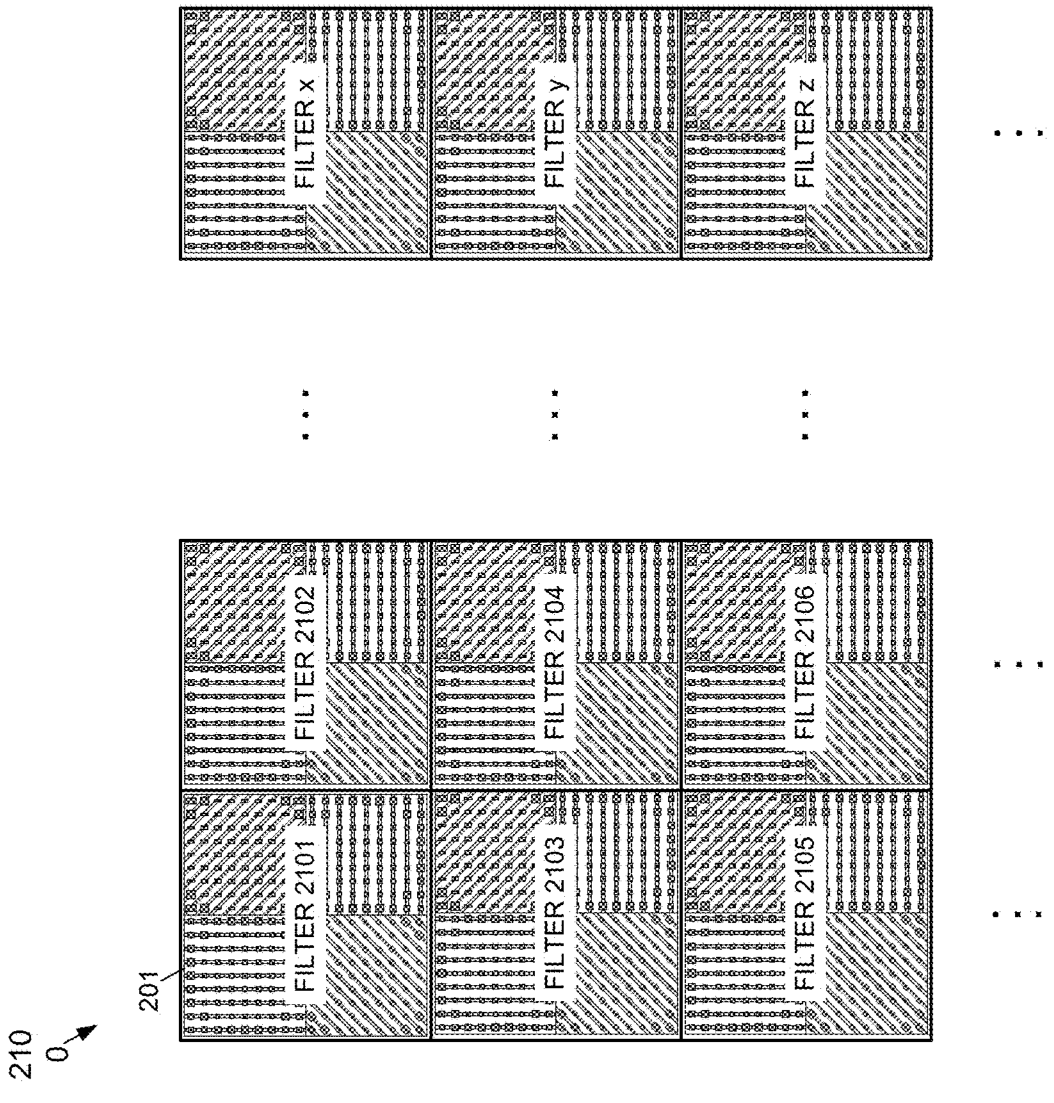
FIG. 21 depicts a top view of an example embodiment of an array of polarizing filters and different spectral filters that may be used with an image sensor to provide on-chip simultaneous full Stokes polarization parameters and multi/hyper spectral imaging according to the subject matter disclosed herein.

FIG. 21 depicts a top view of an example embodiment of an array 2100 of polarizing filters and different spectral filters that may be used with an image sensor to provide on-chip simultaneous full Stokes polarization parameters and multi/hyper spectral imaging according to the subject matter disclosed herein. The array of polarizing filters may include the example embodiment of a polarizer 201. Different spectral filters may be arranged in optical alignment with different polarizers 201. For example, a first filter 2101 may be optically aligned with a polarizer 201, and so on.

Figure 22:
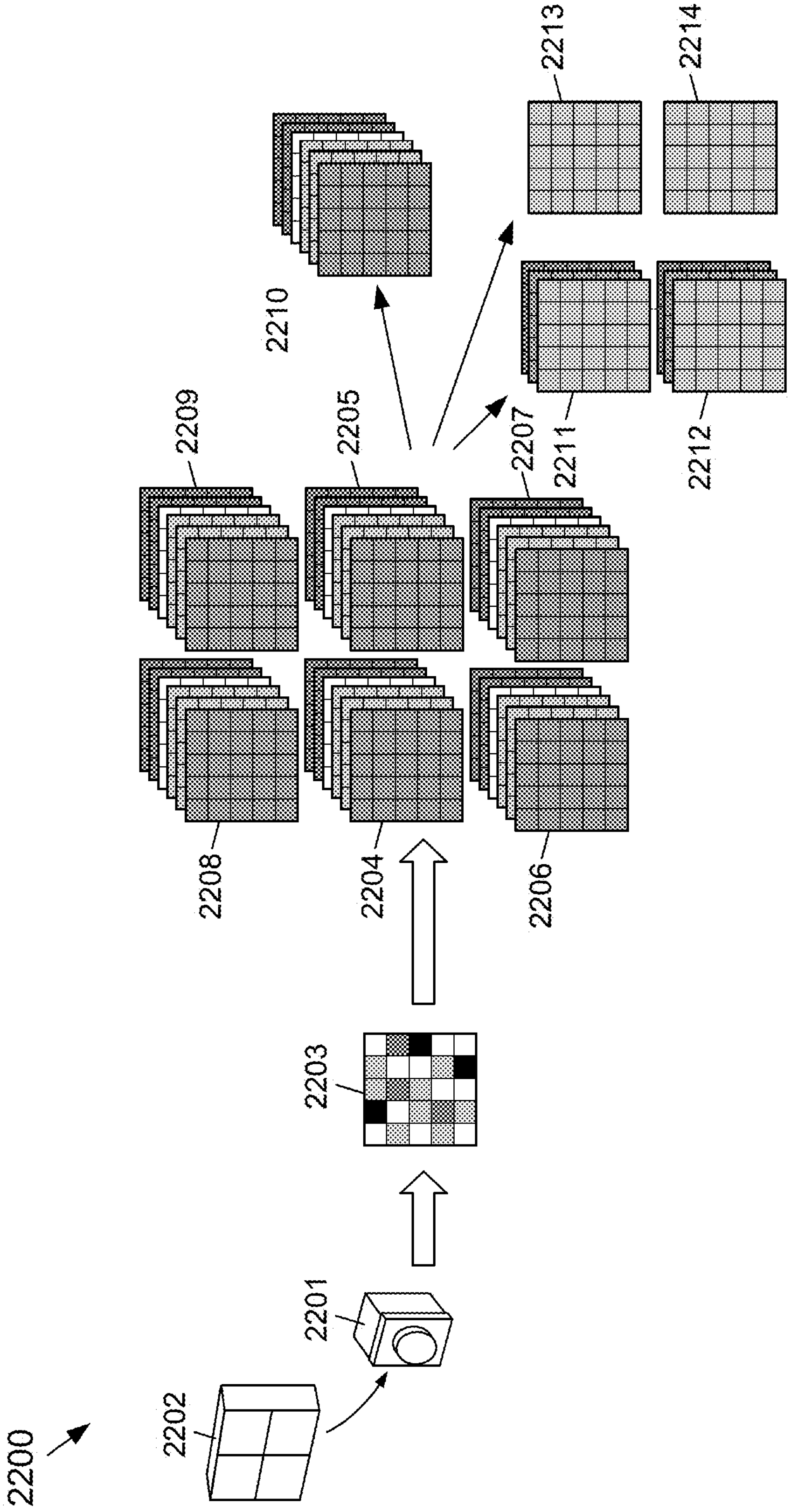
FIG. 22 depicts an imaging system that may include polarizing filters and spectral filters that provide on-chip simultaneous full Stokes polarization parameters (both linear and circular polarization) and multi/hyper spectral imaging according to the subject matter disclosed herein.

FIG. 22 depicts an imaging system 2200 that may include polarizing filters and spectral filters that provide on-chip simultaneous full Stokes polarization parameters (both linear and circular polarization) and multi/hyper spectral imaging according to the subject matter disclosed herein. The imaging system 2200 may include a camera 2201 having an image sensor (not shown). The image sensor may include polarizing and spectral filters 2202, as disclosed herein. An image captured by the image sensor may be processed as a grayscale image 2203 and demosaiced. Additionally, the captured image may be processed to generate images corresponding to multispectral linear and circularly polarized light that passes through the polarizing and spectral filters 2202. For example, depending upon the particular polarizing and spectral filters 2202 that are used, the captured image may generate multispectral horizontally polarized images 2204, multispectral vertically polarized images 2205, diagonally (45 degrees) polarized images 2206, anti-diagonally polarized images 2207, right-hand circularly polarized images 2208, and left-hand circularly polarized images 2209. Parameters determined from the linearly and circularly polarized images 2204-2209 may be used to generate full Stokes parameters for the light of the image.

Further, the captured image may be processed to generate non-polarized multispectral images 2210, and/or red (R), green (G) and blue (B) images 2211. If the multispectral filters include filters for infrared (IR), multispectral IR images 2212 may be generated by the imaging system 2200. Images may be generated that indicate the degree of linear polarization (DoLP) 2213 and the degree of circular polarization (DoCP) 2214 may also be generated.

Figure 23:
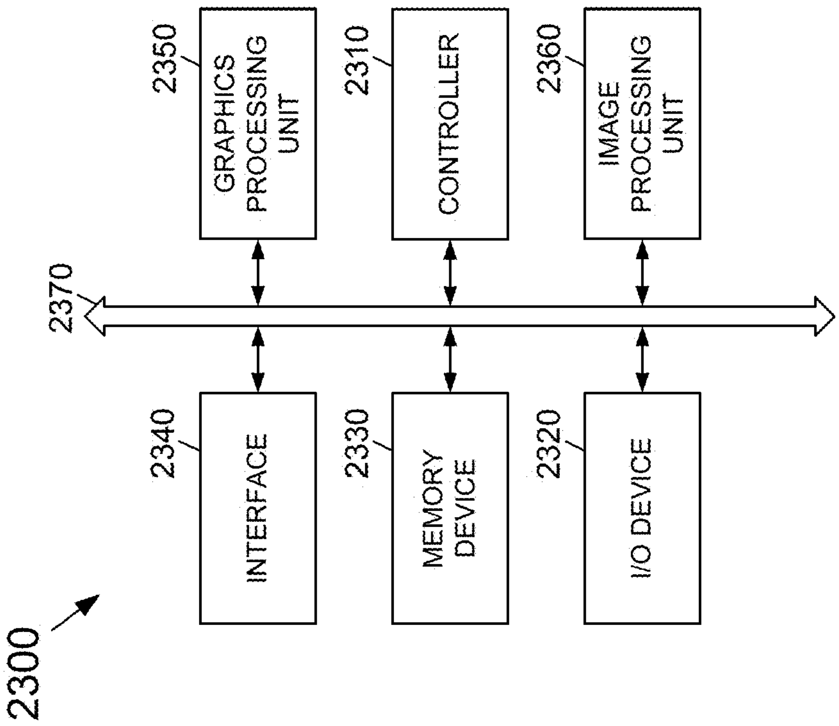
FIG. 23 depicts an electronic device that includes an image sensor having one or more multifunctional polarization filters according to the subject matter disclosed herein.

FIG. 23 depicts an electronic device 2300 that includes an image sensor having one or more multifunctional polarization filters according to the subject matter disclosed herein. Electronic device 2300 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 2300 may also be part of, but not limited to, an ADAS, a mobile-device imaging system, an industrial imaging system, robotics, etc. The electronic device 2300 may include a controller 2310, an input/output device 2320 such as, but not limited to, a keypad, a keyboard, a display, a touch-screen display, a camera, and/or an image sensor, a memory 2330, an interface 2340, a GPU 2350, and an imaging processing unit 2360 that are coupled to each other through a bus 2370. The controller 2380 may include, for example, at least one microprocessor, at least one digital signal processor, at least one microcontroller, or the like. The memory 2330 may be configured to store a command code to be used by the controller 2310 or a user data.

Electronic device 2300 and the various system components of electronic device 2300 may include the image processing unit 2360, which includes an image sensor having multifunctional polarization filters according to the subject matter disclosed herein. The interface 2340 may be configured to include a wireless interface that is configured to transmit data to or receive data from a wireless communication network using a RF signal. The wireless interface 2340 may include, for example, an antenna, a wireless transceiver and so on. The electronic system 2300 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution—Advanced (LTE-Advanced), Multichannel Multipoint Distribution Service (MMDS), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A filter for an imaging device, the filter comprising:

a substrate; and an array of phase-modulating nanostructures formed in a grid pattern on the substrate, at least one phase-modulating nanostructure of the array of phase-modulating nanostructures having a size and changing a phase of incident light a predetermined amount based on the size, and the phase-modulating nanostructure being formed from a material having a refractive index that is greater than 1.9, wherein:

centers of the nanostructures are positioned a half-wavelength from each other, the filter focuses light incident on the filter towards a center of a pixel of an image sensor at an image plane based on the nanostructures having spatially varying dimensions across the array according to a phase map, the phase map is divided into a set of discrete regions respectively assigned nanostructures having defined phase values such that the nanostructures focus the incident light toward the center of the pixel, and a width of a first nanostructure is less than a width of a second nanostructure, the array of phase-modulating nanostructures comprising the first nanostructure and the second nanostructure.

2. The filter of claim 1, wherein the phase-modulating nanostructure inelastically scatters light incident on the filter.

3. The filter of claim 2, wherein a field of view of the filter is at least 30 degrees for a normalized intensity of 1.

4. The filter of claim 1, wherein the phase-modulating nanostructure is formed from at least one of silicon, silicon nitride ($Si3N4$), titanium dioxide ($TiO2$), gallium nitride (GaN), Zinc oxide (ZnO), hafnium silicate, zirconium silicate, hafnium dioxide or zirconium dioxide.

5. The filter of claim 1, wherein the filter comprises a quarter-wave plate.

* * * * *